(12) United States Patent
Durse et al.

(10) Patent No.: US 12,119,585 B2
(45) Date of Patent: Oct. 15, 2024

(54) ELECTRICAL CONNECTOR ASSEMBLY WITH MODULAR COOLING FEATURES

(71) Applicant: Aptiv Technologies AG, Schaffhausen (CH)

(72) Inventors: Nicholas A. Durse, Youngstown, OH (US); Thomas Mathews, Cortland, OH (US); Hoi Lui, Warren, OH (US); William C. Lovitz, Niles, OH (US); Patrick J. Reedy, Youngstown, OH (US)

(73) Assignee: Aptiv Technologies AG, Schaffhausen (CH)

( * ) Notice: Subject to any disclaimer, the term of this patent is extended or adjusted under 35 U.S.C. 154(b) by 238 days.

(21) Appl. No.: 17/726,818

(22) Filed: Apr. 22, 2022

(65) Prior Publication Data

US 2022/0247120 A1    Aug. 4, 2022

Related U.S. Application Data

(63) Continuation of application No. 16/792,929, filed on Feb. 18, 2020, now Pat. No. 11,387,598.

(60) Provisional application No. 62/897,571, filed on Sep. 9, 2019, provisional application No. 62/827,425, filed on Apr. 1, 2019, provisional application No. 62/807,267, filed on Feb. 19, 2019.

(51) Int. Cl.
*H01R 13/533*    (2006.01)
*B60L 50/64*    (2019.01)
*H05K 7/20*    (2006.01)

(52) U.S. Cl.
CPC .......... *H01R 13/533* (2013.01); *B60L 50/64* (2019.02); *H05K 7/20854* (2013.01); *H05K 7/20872* (2013.01); *H01R 2201/26* (2013.01)

(58) Field of Classification Search
None
See application file for complete search history.

(56) References Cited

U.S. PATENT DOCUMENTS

| | | | |
|---|---|---|---|
| 5,606,239 A | 2/1997 | Schumann | |
| 8,098,044 B2 | 1/2012 | Taguchi | |
| 9,192,075 B1 | 11/2015 | Cavallieri | |
| 9,321,362 B2 | 4/2016 | Woo et al. | |
| 10,050,396 B2 | 8/2018 | Schwan | |
| 10,136,564 B2 * | 11/2018 | Takeuchi | ............... H01L 23/40 |
| 10,377,264 B2 | 8/2019 | Lopez et al. | |
| 10,449,871 B1 | 10/2019 | Lyon | |
| 10,476,184 B2 * | 11/2019 | Menez | ............. H01M 10/6556 |
| 10,535,940 B2 | 1/2020 | Fuehrer et al. | |

(Continued)

FOREIGN PATENT DOCUMENTS

| | | |
|---|---|---|
| CN | 110267484 A | 9/2019 |
| DE | 202008006117 U1 | 7/2008 |

(Continued)

*Primary Examiner* — Tho D Ta
(74) *Attorney, Agent, or Firm* — Billion & Armitage

(57) ABSTRACT

An electrical connector assembly includes a connector housing defining a cavity in which a pair of electrical terminals is disposed. The assembly also includes a cover that is configured to enclose the cavity, thereby protecting the pair of electrical terminals and thermally manage heat within the cavity. The cover has a thermal management mechanism including one or more liquid ports configured to receive a liquid coolant flow.

18 Claims, 23 Drawing Sheets

(56) References Cited

U.S. PATENT DOCUMENTS

| | | | |
|---|---|---|---|
| 10,644,439 B2 | 5/2020 | Fuehrer et al. | |
| 10,756,498 B1 | 8/2020 | Sarraf et al. | |
| 10,861,619 B2 | 12/2020 | Lee et al. | |
| 2015/0189790 A1* | 7/2015 | Tachibana | H05K 7/20927 |
| | | | 361/699 |
| 2016/0174356 A1 | 6/2016 | Singh et al. | |
| 2019/0074620 A1 | 3/2019 | Moseke | |
| 2019/0126764 A1 | 5/2019 | Führer | |

FOREIGN PATENT DOCUMENTS

| | | | |
|---|---|---|---|
| DE | 102009041968 A1 | 4/2011 | |
| EP | 2242100 A1 | 10/2010 | |

\* cited by examiner

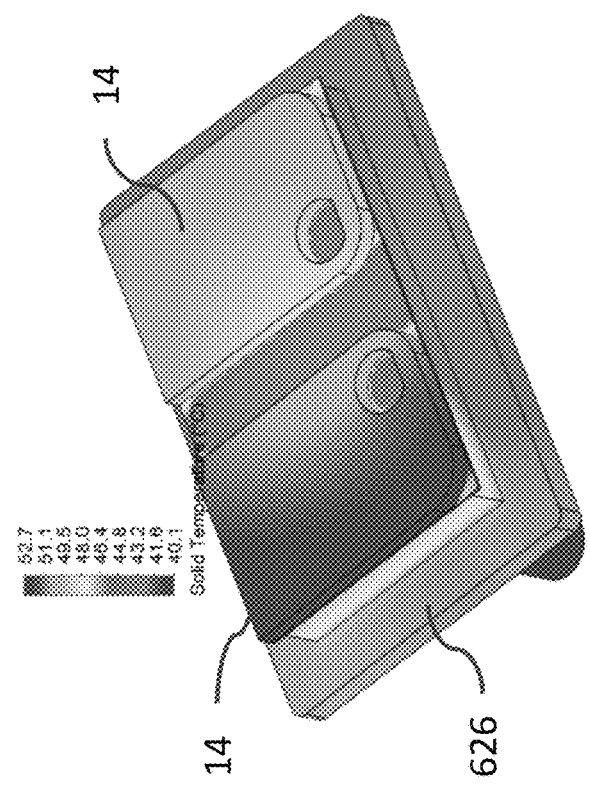
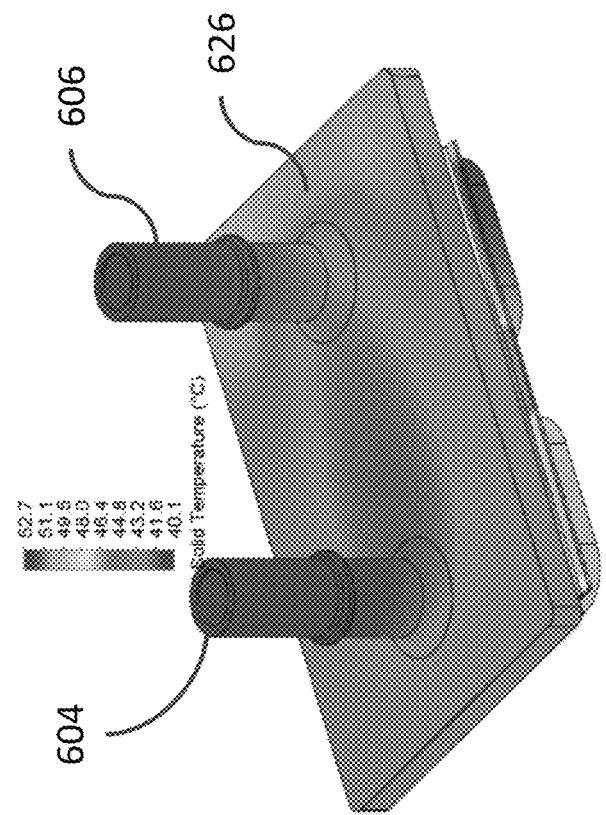
Fig. 23A
Fig. 23B

ELECTRICAL CONNECTOR ASSEMBLY WITH MODULAR COOLING FEATURES

CROSS-REFERENCE TO RELATED APPLICATION

This application is a continuation application and claims the benefit of application U.S. patent application Ser. No. 16/792,929 filed on Feb. 18, 2020 which claimed the benefit under 35 U.S.C. § 119(e) of U.S. Provisional Patent Application No. 62/807,267 filed on Feb. 19, 2019, U.S. Provisional Patent Application No. 62/827,425 filed on Apr. 1, 2019, and U.S. Provisional Patent Application No. 62/897,571 filed on Sep. 9, 2019, the entire disclosure of each of which is hereby incorporated by reference.

TECHNICAL FIELD OF THE INVENTION

The invention relates to electrical connector assemblies, particularly electrical connector assemblies configured to accommodate a variety of different modular cooling features.

BACKGROUND OF THE INVENTION

High power electrical connector assemblies, such as those used with fast charging systems for electrical vehicles must be designed to carry 90 kilowatts of electrical power or more. Contact resistance between electrical terminal elements in the electrical connector assembly may cause power losses which are converted to thermal energy within the connector assembly. This thermal energy can cause a temperature rise within the electrical connector assembly that may damage the assembly if thermal limits are exceeded.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

According to one or more aspects of the present disclosure, an electrical connector assembly includes a connector housing defining a cavity in which a pair of electrical terminals is disposed and a cover that is configured to enclose the cavity, thereby protecting the pair of electrical terminals and thermally manage heat within the cavity. The cover has a thermal management mechanism including one or more liquid ports configured to receive a liquid coolant flow.

In one or more embodiments of the electrical connector assembly according to the previous paragraph, the cover includes a coolant duct having a liquid inlet port and a liquid outlet port configured to carry the liquid coolant flow therethrough.

In one or more embodiments of the electrical connector assembly according to any one of the previous paragraphs, the coolant duct is characterized as following a serpentine path through the cover.

In one or more embodiments of the electrical connector assembly according to any one of the previous paragraphs, the cover is formed of an electrically nonconductive material.

In one or more embodiments of the electrical connector assembly according to any one of the previous paragraphs, the cover is formed of a thermally conductive polymer.

In one or more embodiments of the electrical connector assembly according to any one of the previous paragraphs, the cover includes a top cover having a liquid inlet port and a liquid outlet port and a bottom cover that defines a coolant duct.

In one or more embodiments of the electrical connector assembly according to any one of the previous paragraphs, the top cover is formed of a polymeric material.

In one or more embodiments of the electrical connector assembly according to any one of the previous paragraphs, the bottom cover is formed of a metallic material.

In one or more embodiments of the electrical connector assembly according to any one of the previous paragraphs, the bottom cover includes a plurality of cooling fins that define a plurality of coolant channels within the coolant duct.

In one or more embodiments of the electrical connector assembly according to any one of the previous paragraphs, the electrical connector assembly further includes a dielectric thermal interface material layer in direct contact with the pair of electrical terminals. The dielectric thermal interface material layer is disposed between the bottom cover and the pair of electrical terminals.

In one or more embodiments of the electrical connector assembly according to any one of the previous paragraphs, the dielectric thermal interface material layer is in direct contact with the bottom cover.

In one or more embodiments of the electrical connector assembly according to any one of the previous paragraphs, the electrical connector assembly further includes an additional dielectric material layer intermediate the dielectric thermal interface material layer and the plurality of coolant channels.

In one or more embodiments of the electrical connector assembly according to any one of the previous paragraphs, the electrical connector assembly further includes a primary coolant seal between the top cover and the bottom cover.

In one or more embodiments of the electrical connector assembly according to any one of the previous paragraphs, the electrical connector assembly further includes a secondary seal between the cover and the cavity.

In one or more embodiments of the electrical connector assembly according to any one of the previous paragraphs, the liquid inlet port and the liquid outlet port are interconnected to a liquid cooling system of an electrically propelled vehicle.

In one or more embodiments of the electrical connector assembly according to any one of the previous paragraphs, the cover is formed of a thermally conductive material.

In one or more embodiments of the electrical connector assembly according to any one of the previous paragraphs, the cavity is filled with a thermally conductive potting material in thermal communication with the cover.

In one or more embodiments of the electrical connector assembly according to any one of the previous paragraphs, the cavity is filled with a phase changing material in thermal communication with the cover.

BRIEF DESCRIPTION OF THE SEVERAL VIEWS OF THE DRAWING

The present invention will now be described, by way of example with reference to the accompanying drawings, in which:

FIG. 23A is a temperature gradient top view of the liquid cooling plate of FIG. 17 according to one embodiment of the invention; and FIG. 23B is a temperature gradient bottom view of the liquid cooling plate of FIG. 17 according to one embodiment of the invention.

DETAILED DESCRIPTION OF THE INVENTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
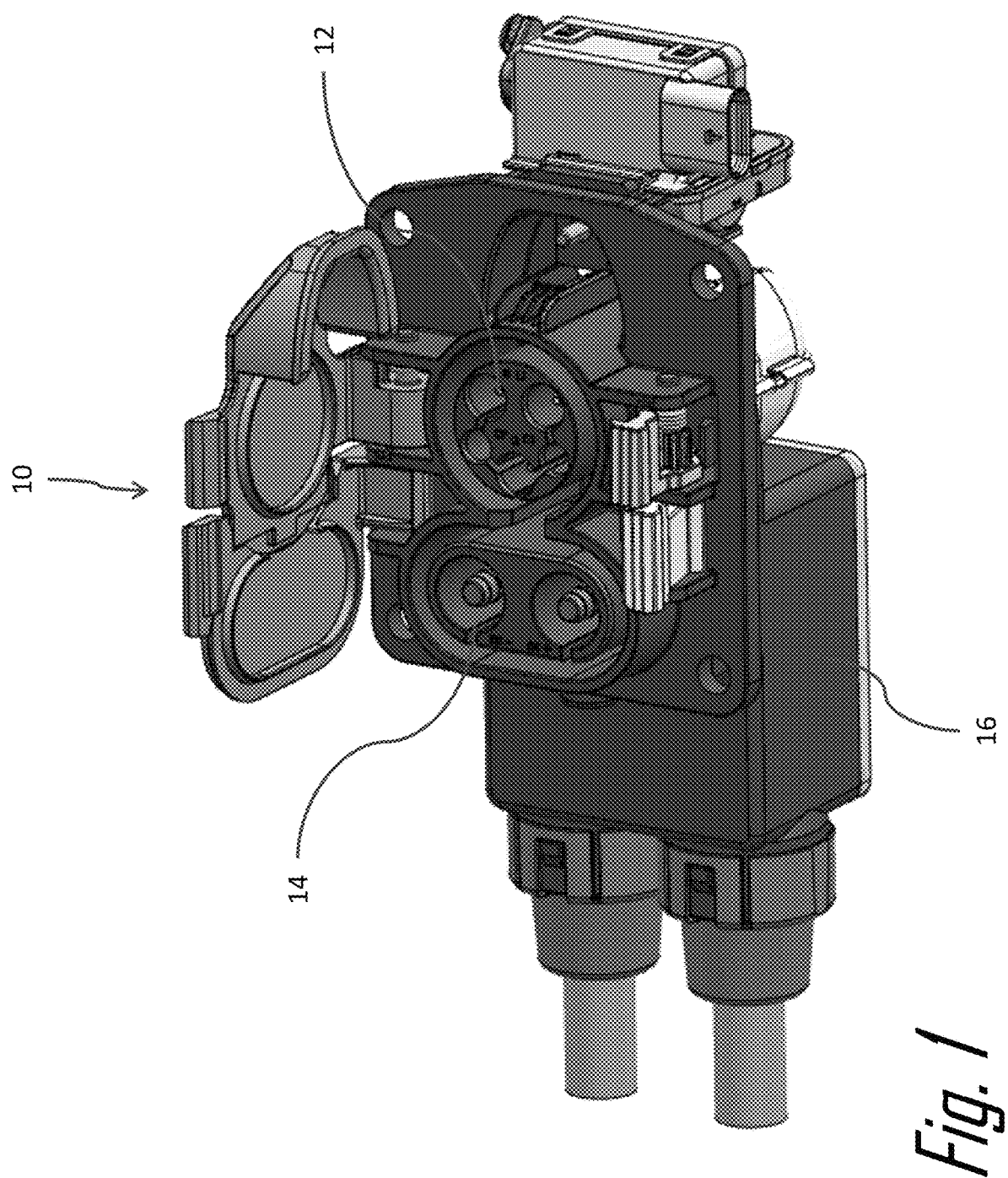
FIG. 1 is perspective front view of an electrical connector assembly according to one embodiment of the invention.

FIGS. 1 through 15 illustrate a non-limiting example of an electrical connecter assembly embodying features of the invention. The illustrated example of the electrical connector assembly, hereinafter referred to as the assembly 10, serves a charging port of an electrically propelled vehicle. As used herein, the term "electrically propelled vehicle" may refer to an electric vehicle which is propelled solely by an electric motor or a hybrid electric vehicle which is propelled by an electric motor in some combination with a combustion engine. The assembly 10 as illustrated conforms to Society of Automotive Engineers (SAE) Specification J1772 Combined Charging System. The assembly 10 has a combination of electrical terminals 12 for lower power alternating current (AC) charging of the vehicle battery and a pair of DC terminals 14 for higher power direct current (DC) charging of the vehicle battery, as shown in FIG. 1. Other charging port standards, such as standards published by the CHAdeMO Association, use a similar pair of DC terminals.

Figure 2:
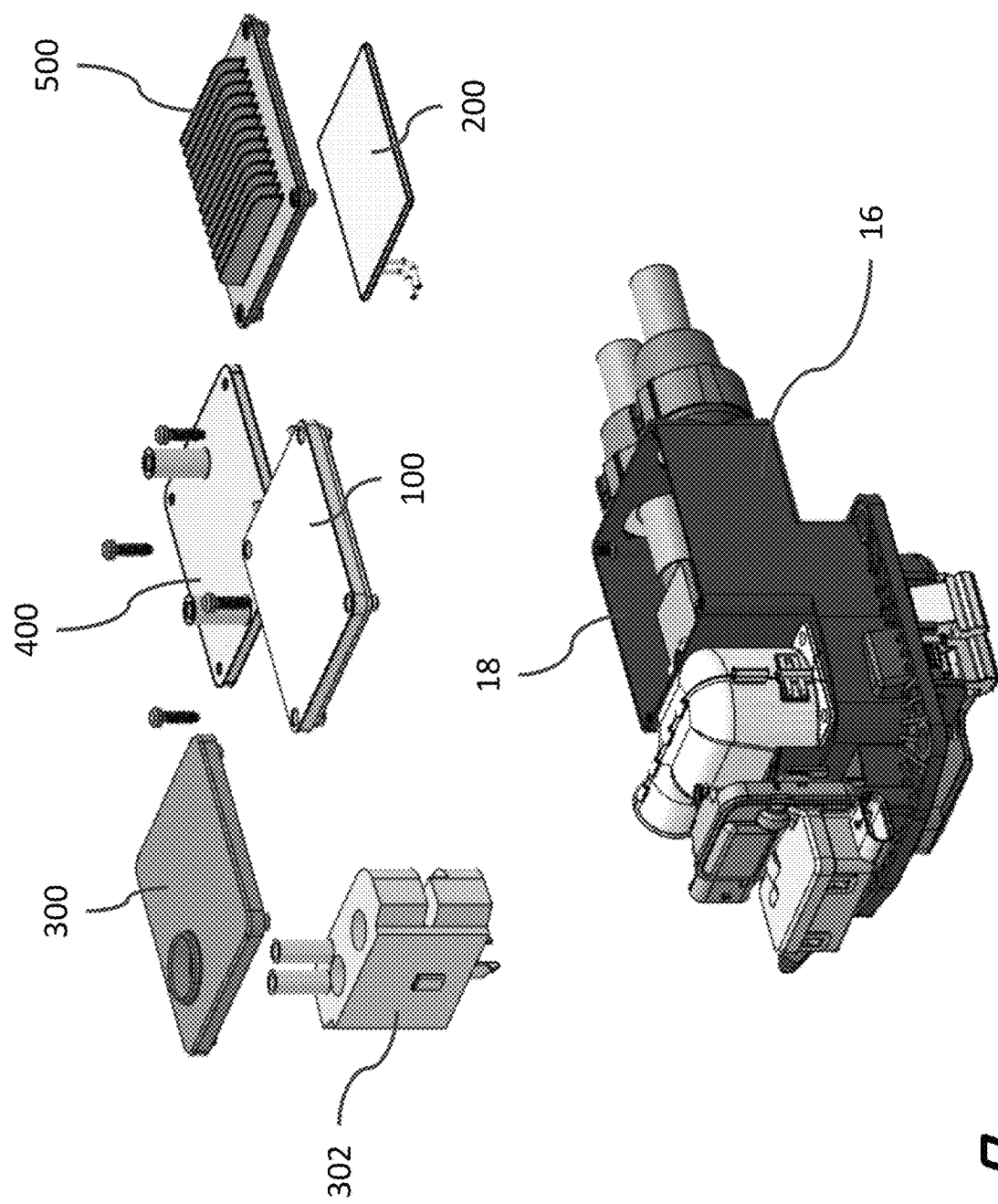
FIG. 2 is an exploded perspective rear view of the electrical connector assembly of FIG. 1 showing a plurality of different cover configurations according to one embodiment of the invention.
Figure 3:
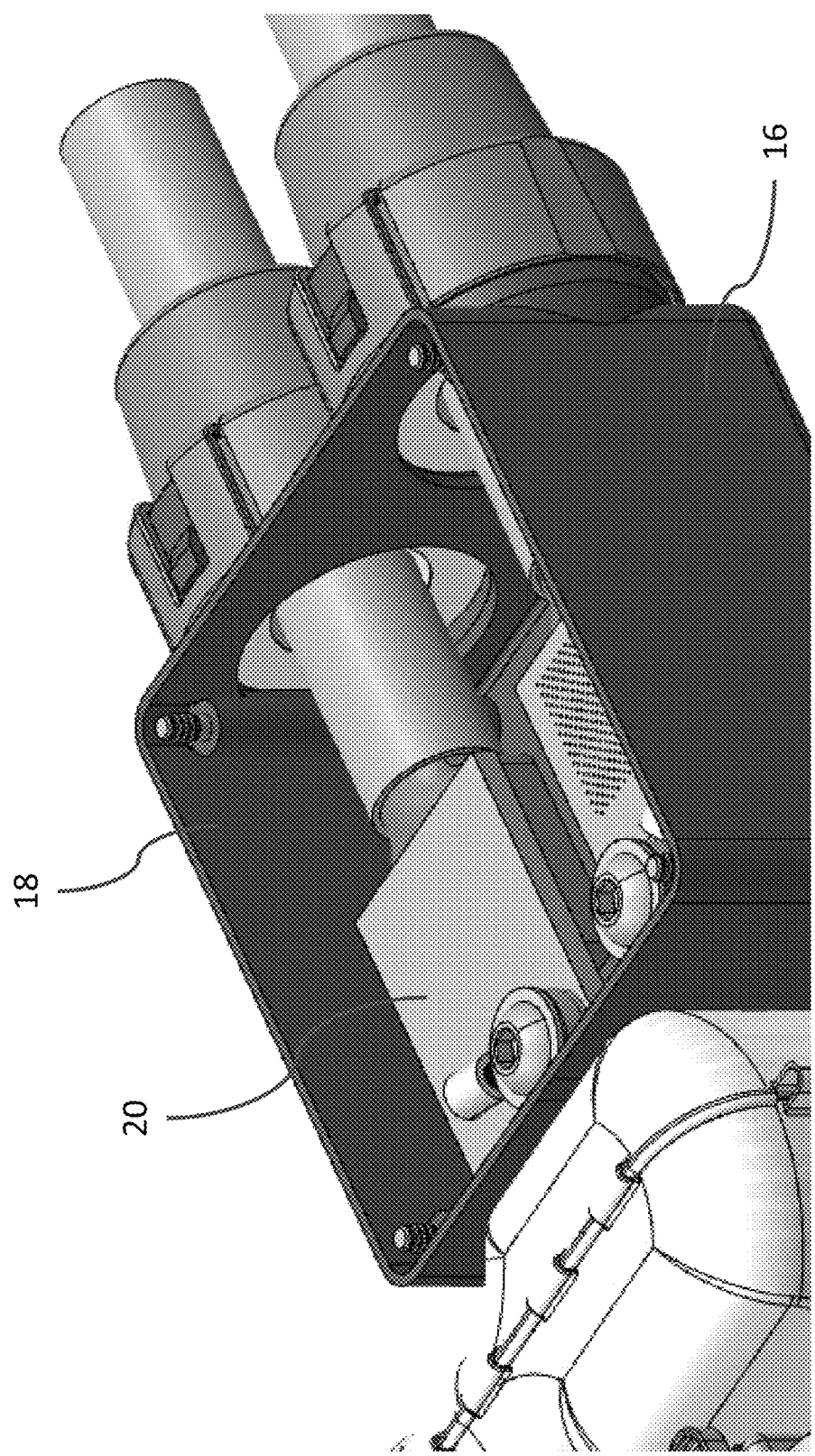
FIG. 3 is a close up perspective rear view of an opening in a connector housing of the electrical connector assembly of FIG. 1 according to one embodiment of the invention.

As shown in FIG. 2, the assembly includes a connector housing, hereinafter referred to as the housing 16, that defines a cavity 18 in which the DC terminals 14 are disposed. As can be seen by referencing FIGS. 3, 7, and 15, the DC terminals 14 are interconnected to cable terminals 20 of insulated wire cables connecting the assembly 10 to the battery pack 22 of the vehicle. The DC terminals 14 carry power levels of 90 kilowatts or more which can cause the temperature to rise within the cavity 18 during the battery charging operation. The assembly 10 further includes a cover that is configured to enclose the cavity 18, thereby protecting the DC terminals 14 and the cable terminals 20. The cover is also configured to thermally manage heat within the cavity 18 by removing thermal energy from the cavity 18.

The housing 16 is designed to receive and accommodate several different cover configurations 100, 200, 300, 400, 500. Each of the cover configurations 100, 200, 300, 400, 500 uses a different thermal management mechanism to thermally manage heat within the cavity 18. The cover configurations 100, 200, 300, 400, 500 include active thermal management mechanisms such as one or more liquid ports that are configured to receive a liquid coolant flow within the cavity 18, one or more thermoelectric cooling plates, and/or one or more airflow ports that are configured to receive an airflow within the cavity 18 and/or passive thermal management mechanisms, such as one or more cooling fins 502 projecting from the cover 500.

Figure 4:
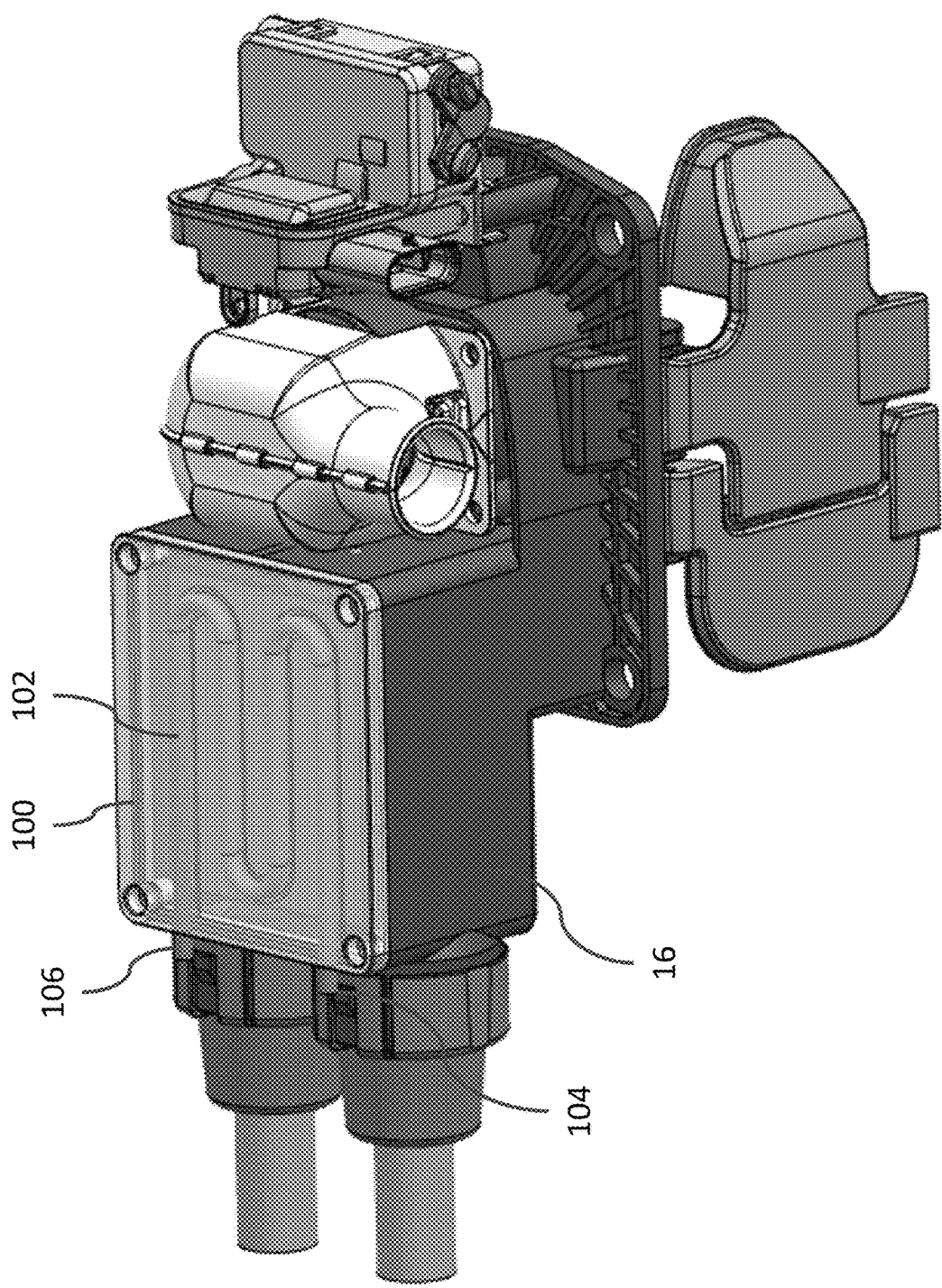
FIG. 4 is a perspective left side view of the electrical connector assembly of FIG. 1 showing a cover having coolant tube running through the cover according to one embodiment of the invention.
Figure 5:
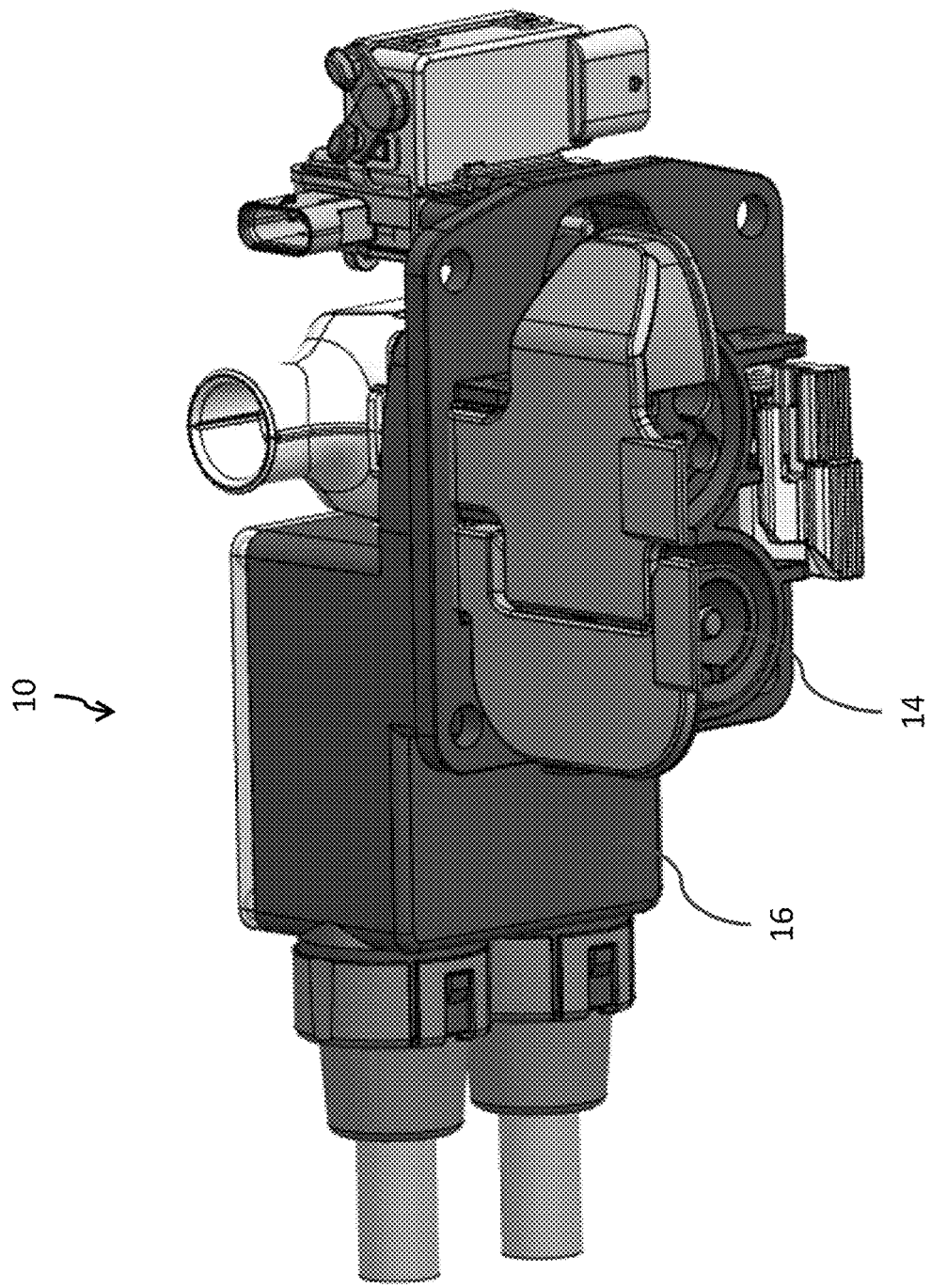
FIG. 5 is a perspective right side view of the electrical connector assembly of FIG. 4 according to one embodiment of the invention.
Figure 6:
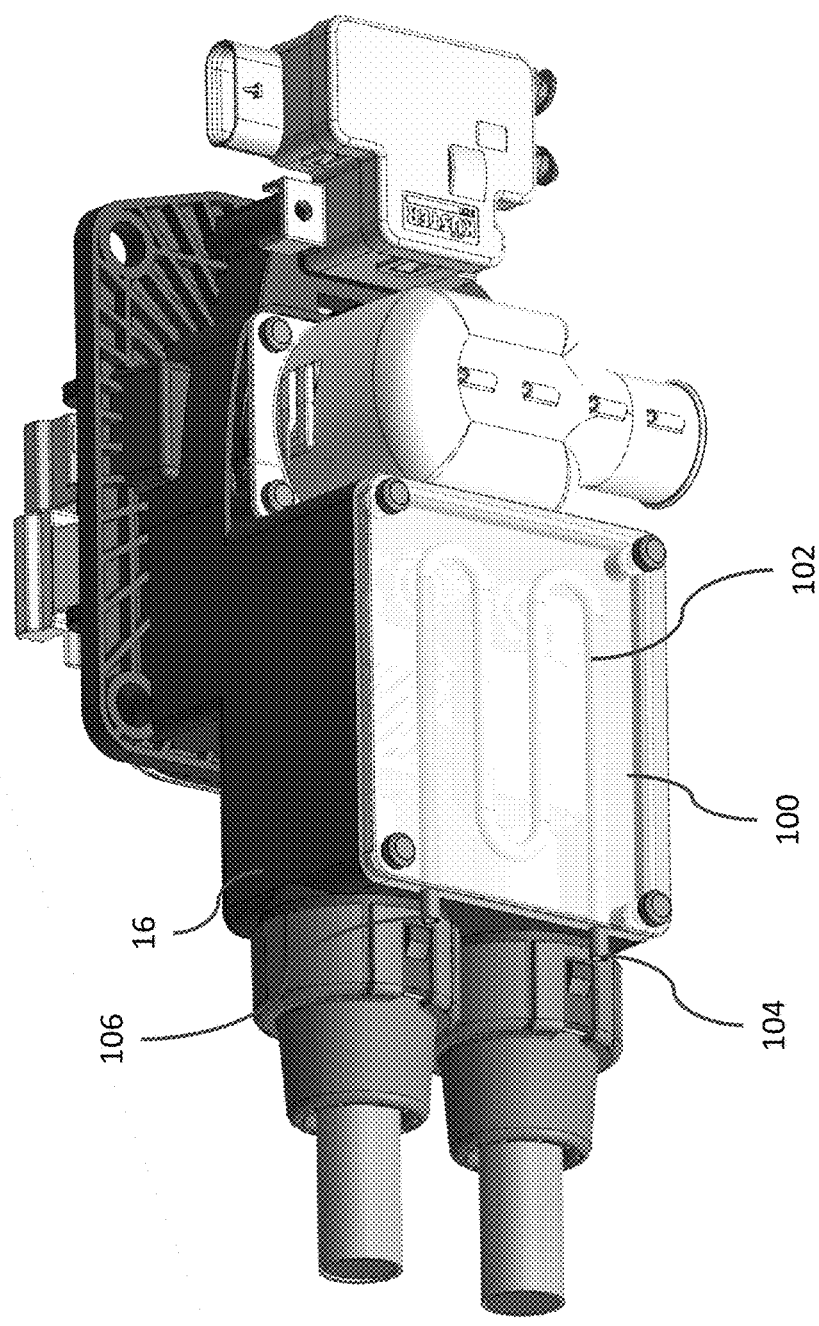
FIG. 6 is a perspective rear view of the electrical connector assembly of FIG. 4 according to one embodiment of the invention.
Figure 7:
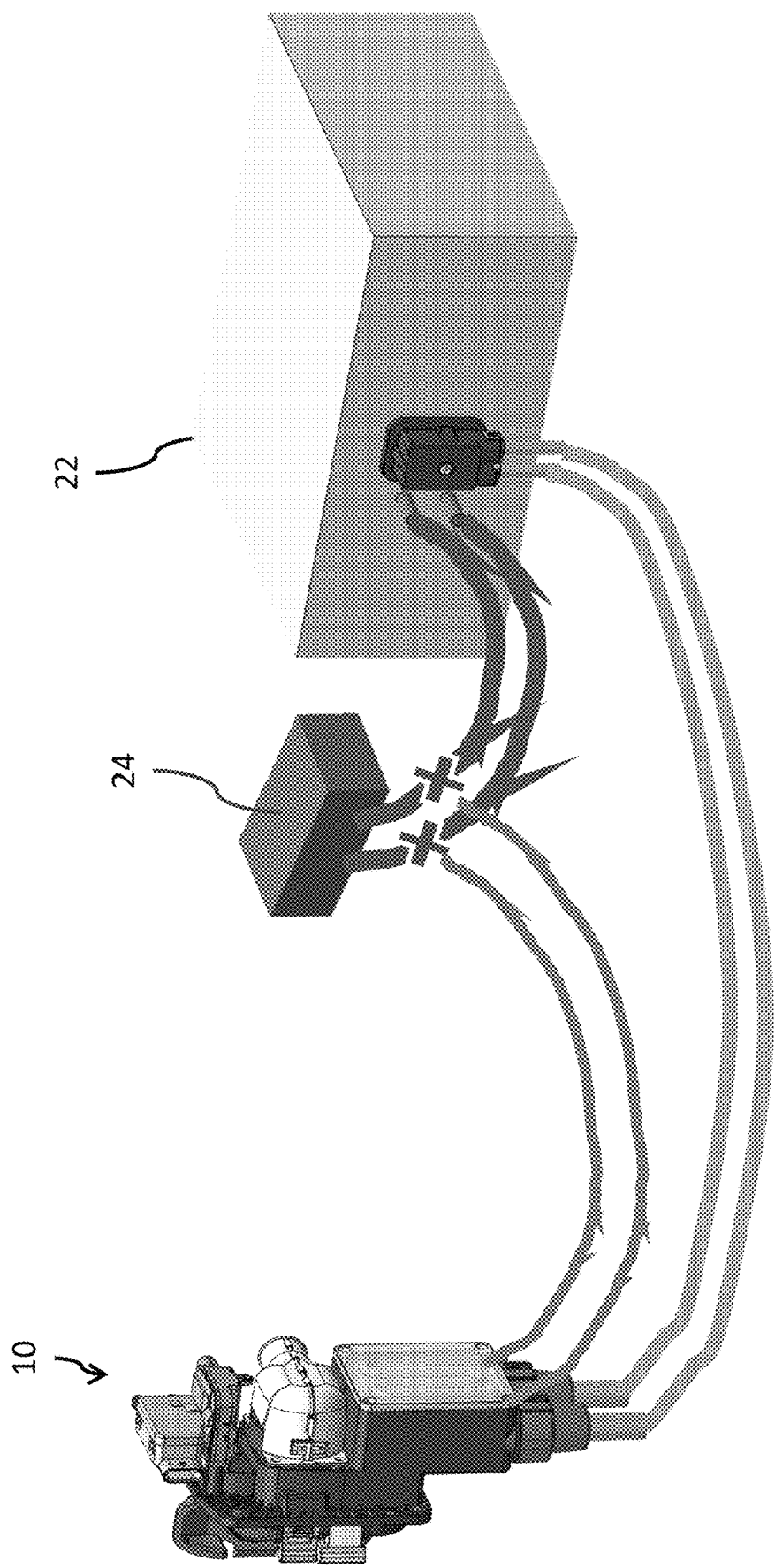
FIG. 7 is a schematic diagram of the coolant tube of the electrical connector assembly of FIG. 4 interconnected with a cooling system of an electrically propelled vehicle according to one embodiment of the invention.

In a first cover configuration 100 having an active thermal management mechanism shown in FIGS. 4-7, the cover 100 comprises an active thermal management system featuring an enclosed coolant tube 102 that is configured to carry a liquid coolant flow through the cover 100. The coolant tube has a liquid inlet port 104 and a liquid outlet port 106 that is interconnected with the vehicle's cooling system 24, e.g., a liquid cooling system that cools the vehicle battery pack 22 and/or the vehicle power electronics as illustrated in FIG. 7. The vehicle's cooling system 24 includes a pump or other fluid movement device that causes the liquid coolant to flow through the cooling tube. As shown in FIGS. 4 and 6, the coolant tube follows a serpentine path through the cover, thereby increasing the length of the coolant tube and increasing the amount of thermal energy that can be absorbed from the cavity 18 by the coolant it flows through the cover. The cover may preferably be formed on a material with a high thermal conductivity, such as an aluminum or copper-based material, to provide adequate thermal transfer between the cavity 18 and the liquid coolant. Alternatively, the cover may be formed of a thermally conductive polymer.

Figure 8:
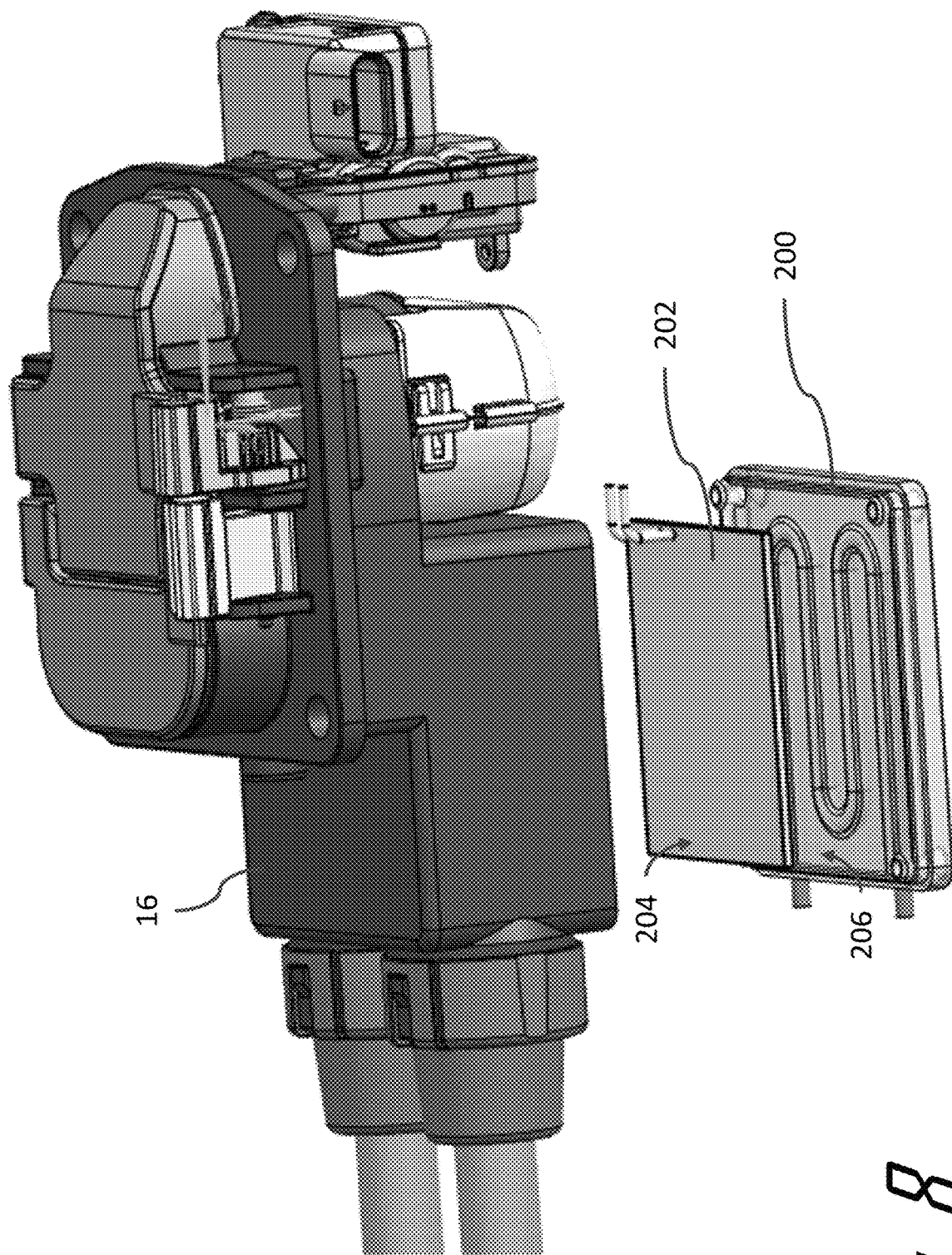
FIG. 8 is an exploded view of the electrical connector assembly of FIG. 4 including a thermoelectric device according to one embodiment of the invention.

According to a second cover configuration 200 an active thermal management mechanism shown in FIG. 8, the cover 200 includes a thermoelectric device 202 which uses the Peltier effect to actively cool the cavity 18. An electrical voltage is applied to the thermoelectric device 202 such that a side 204 of the thermoelectric device 202 facing inwardly toward the cavity 18 is cooled while another side 206 of the thermoelectric device 202 facing outward is heated by the thermal energy removed from the cooled side 204. The thermoelectric device 202 may be used as the sole thermal management mechanism in the assembly 10 or combined with any one of the other described cover configurations 100, 300, 400, 500.

Figure 9:
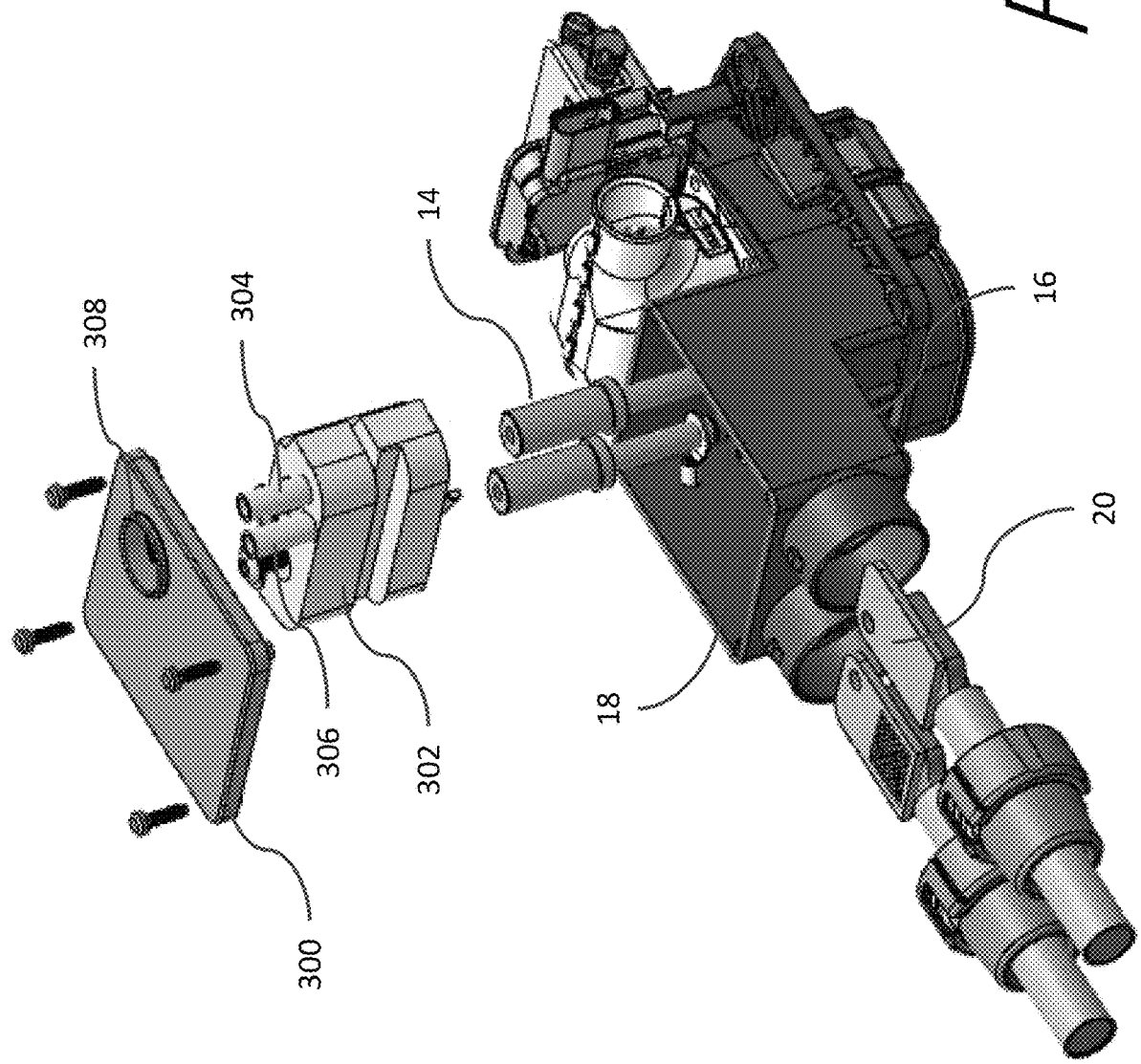
FIG. 9 is an exploded view of the electrical connector assembly of FIG. 1 showing a member having a coolant duct terminated by a pair of liquid ports according to one embodiment of the invention.
Figure 10:
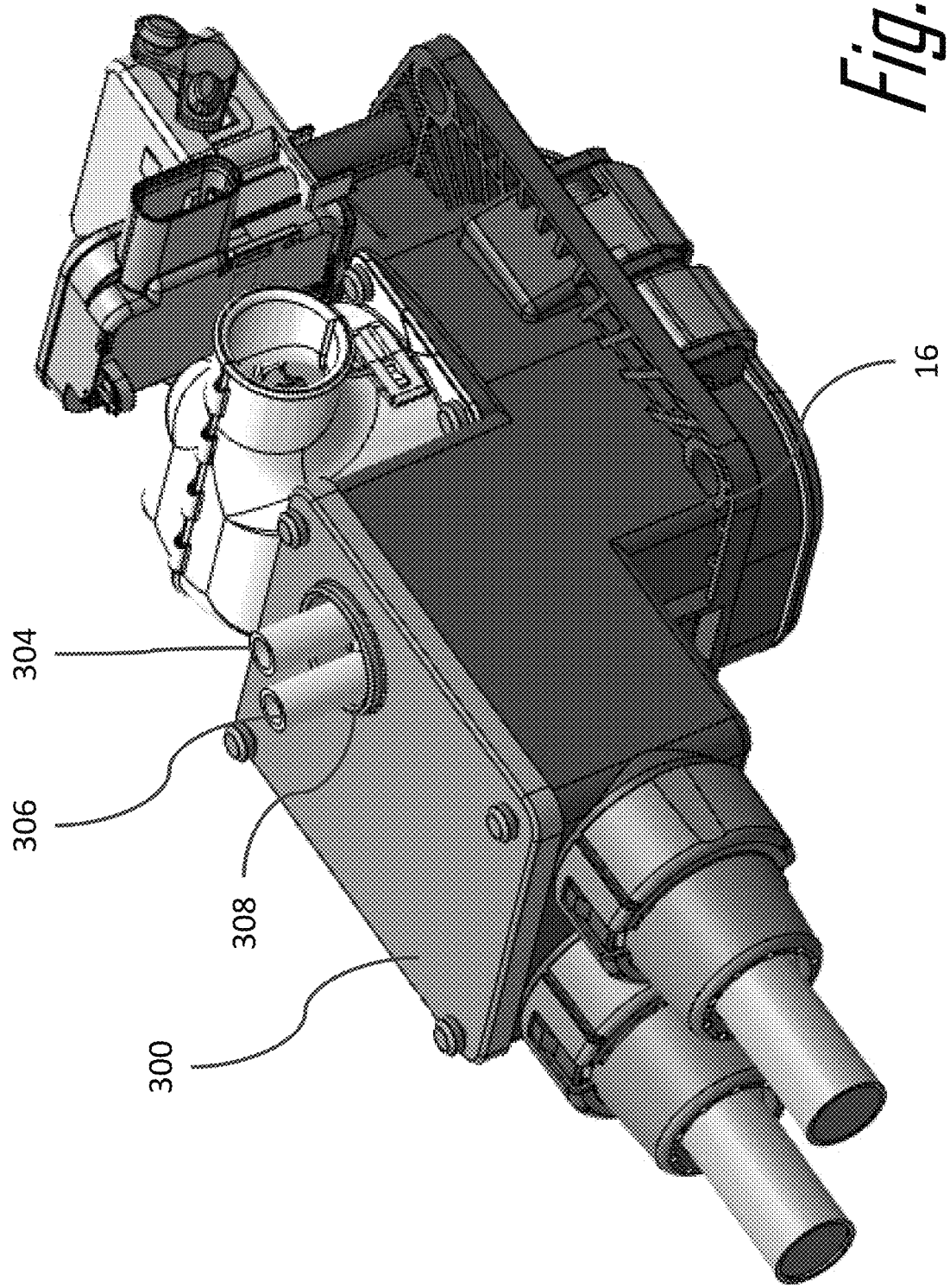
FIG. 10 is a perspective left side view of the electrical connector assembly of FIG. 9 showing a cover having the pair of liquid ports extending through an aperture in the cover according to one embodiment of the invention.

In a third cover configuration 300 an active thermal management mechanism illustrated in FIGS. 9 and 10, the assembly 10 further comprises an electrically nonconductive terminal position assurance (TPA) member 302 that encloses a portion of the DC terminals 14 and is in thermal communication with the DC terminals 14. The TPA member 302 comprises a coolant duct configured to carry a liquid coolant flow through the TPA member 302. The TPA member 302 provide s the benefit of removing thermal energy directly from the DC terminals 14 which are one of the primary heat sources within the cavity 18. The coolant duct has a liquid inlet port 304 and a liquid outlet port 306 that is interconnected with the vehicle's cooling system 24, e.g., a liquid cooling system that cools the vehicle battery pack 22 and/or the vehicle power electronics similar to the illustration of FIG. 7. The vehicle's cooling system 24 includes a pump that causes the liquid coolant to flow through the cooling duct. The cover 300 defines an aperture 308 through which the liquid inlet port 304 and the liquid outlet port 306 exit the cavity 18. In an alternative embodiment, the liquid inlet port 304 and the liquid outlet port 306 may be interconnected with a cooling system dedicated to cooling the assembly 10.

Figure 11:
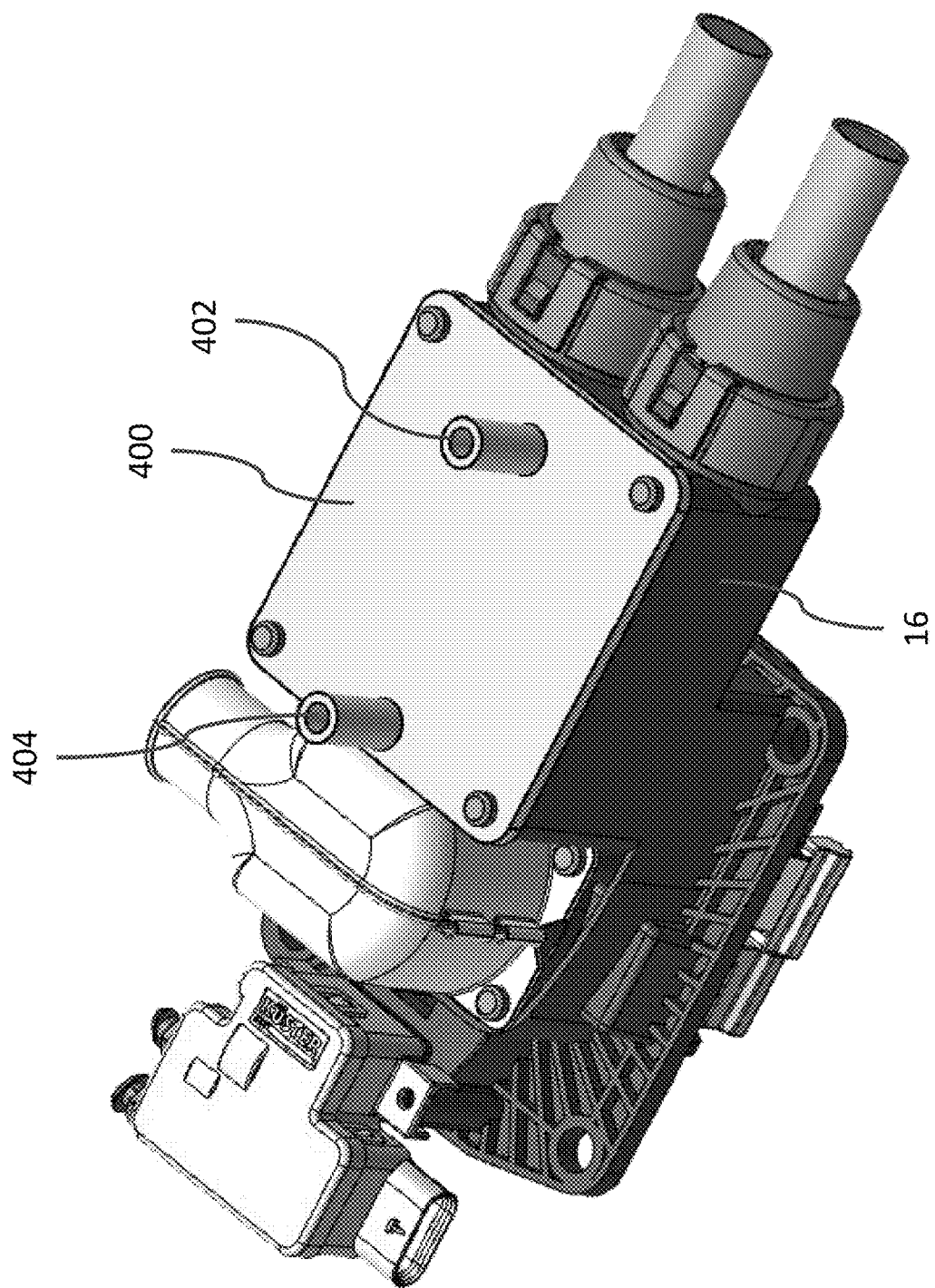
FIG. 11 is a perspective right side view of the electrical connector assembly of FIG. 1 showing a cover having a pair of airflow ports extending through the cover according to one embodiment of the invention.
Figure 12:
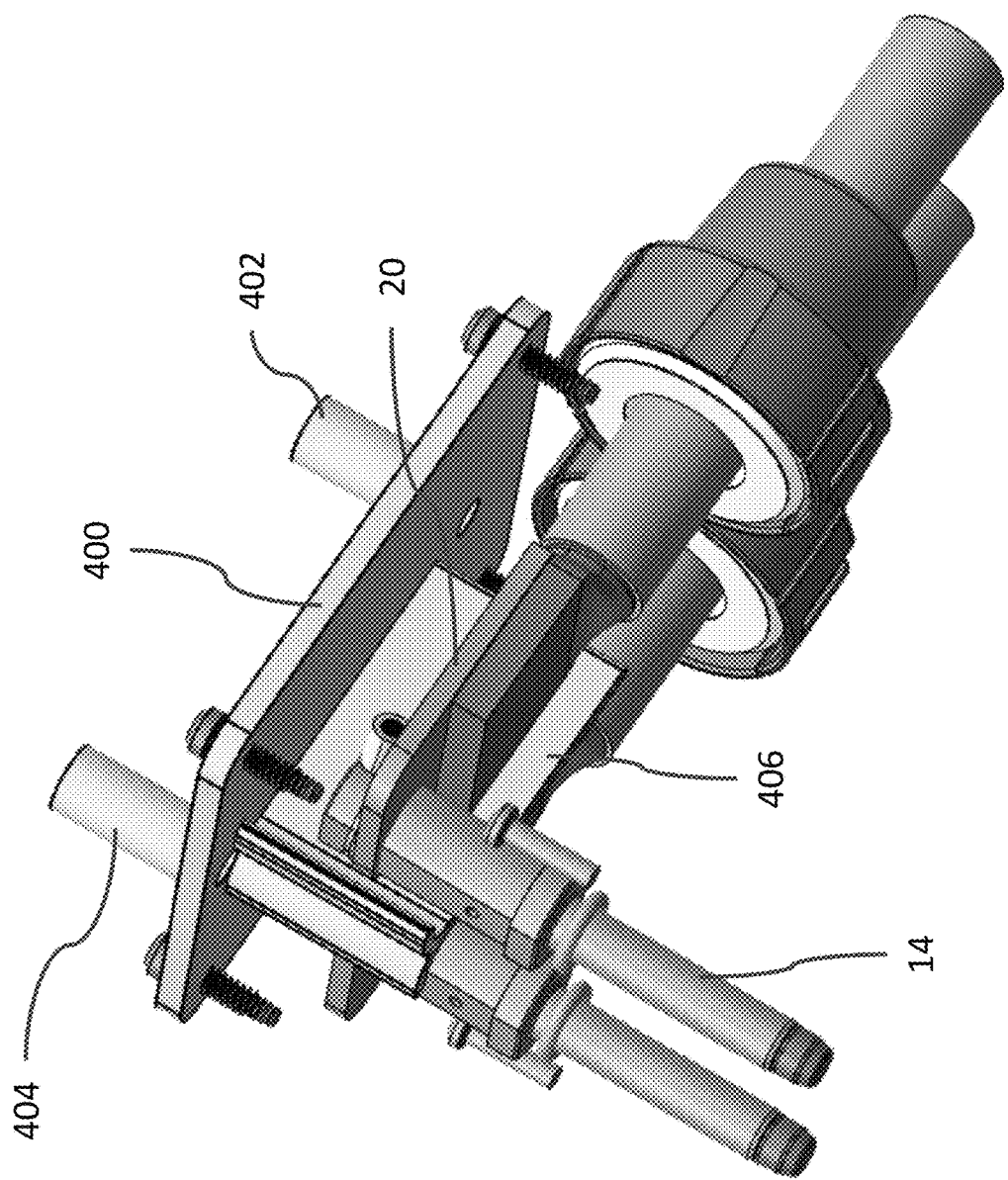
FIG. 12 is a partial exploded view of the electrical connector assembly of FIG. 11 showing the cover and an interconnection between a pair of terminals according to one embodiment of the invention.
Figure 13:
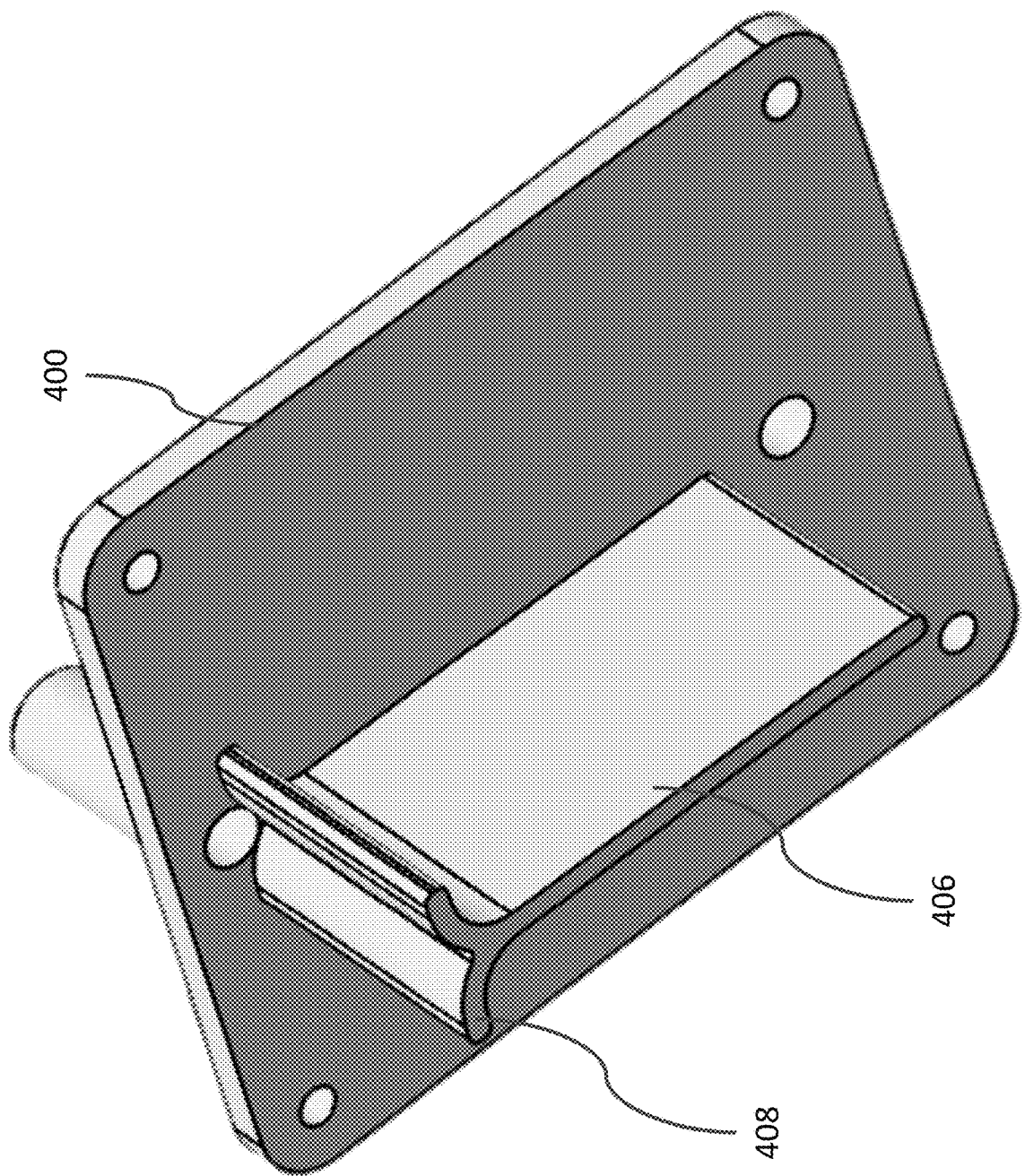
FIG. 13 is a perspective bottom view of the cover of the electrical connector assembly of FIG. 11 showing a baffle according to one embodiment of the invention.

A fourth cover configuration 400 having an active thermal management mechanism is illustrated in FIGS. 11-13. The cover 400 is in pneumatic and thermal communication with the cavity 18. The cover 400 includes an airflow inlet port 402 though which airflow of air at the vehicle's ambient temperature enters the cavity 18 and an airflow outlet port 404 through which the airflow is exhausted from the cavity 18. The airflow inlet port 402 is interconnected to an airflow generating device of the vehicle, such as a ducted fan. The airflow through the cavity 18 removes some of the thermal energy from the cavity 18, thereby lowing the temperature within the cavity 18. An inner surface of the cover 400 defines a baffle 406 configured to direct the airflow within the cavity 18. The baffle 406 also includes a curved surface 408 that helps to create a turbulent airflow within the cavity 18. The cover 400 and the baffle 406 may be preferably formed of a dielectric polymer material to avoid short circuiting that may be caused by contact between the baffle 406 and any of the terminals within the cavity 18.

Figure 14:
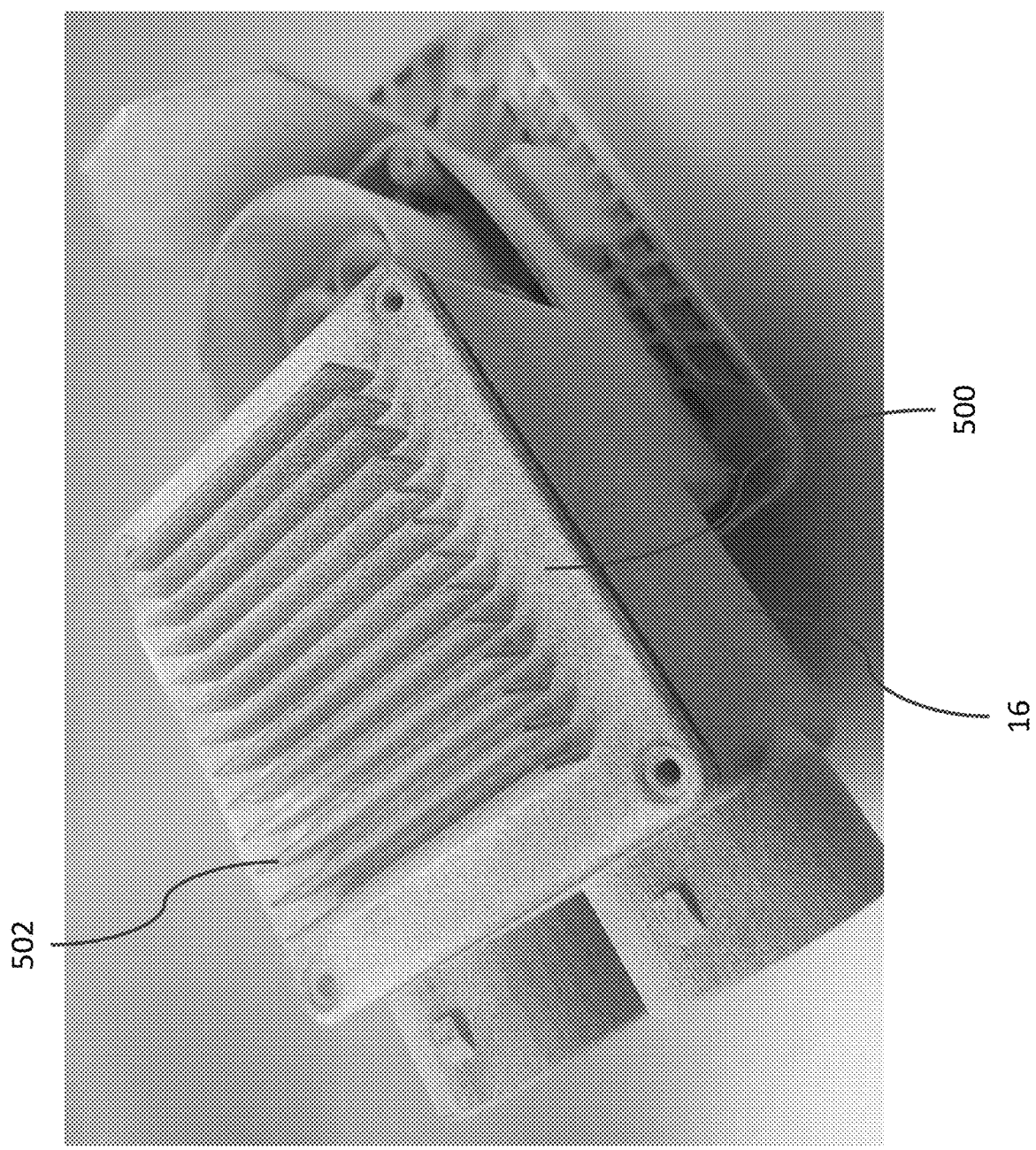
FIG. 14 is a perspective rear view of the electrical connector assembly of FIG. 1 showing a cover having a plurality of cooling fins extending from the cover according to one embodiment of the invention.
Figure 15:
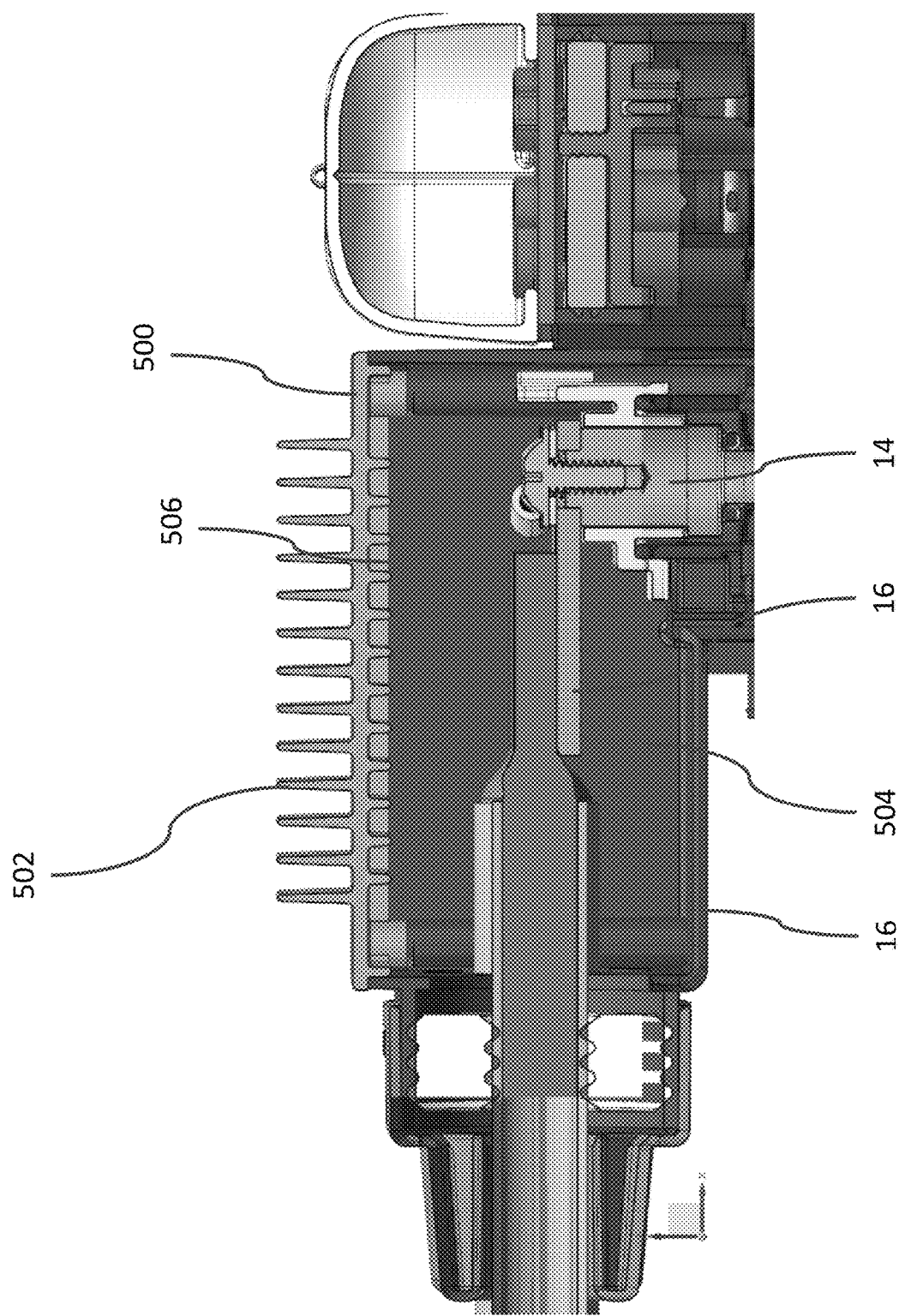
FIG. 15 is a cross section view of the electrical connector assembly of FIG. 14 according to one embodiment of the invention.
Figure 16:
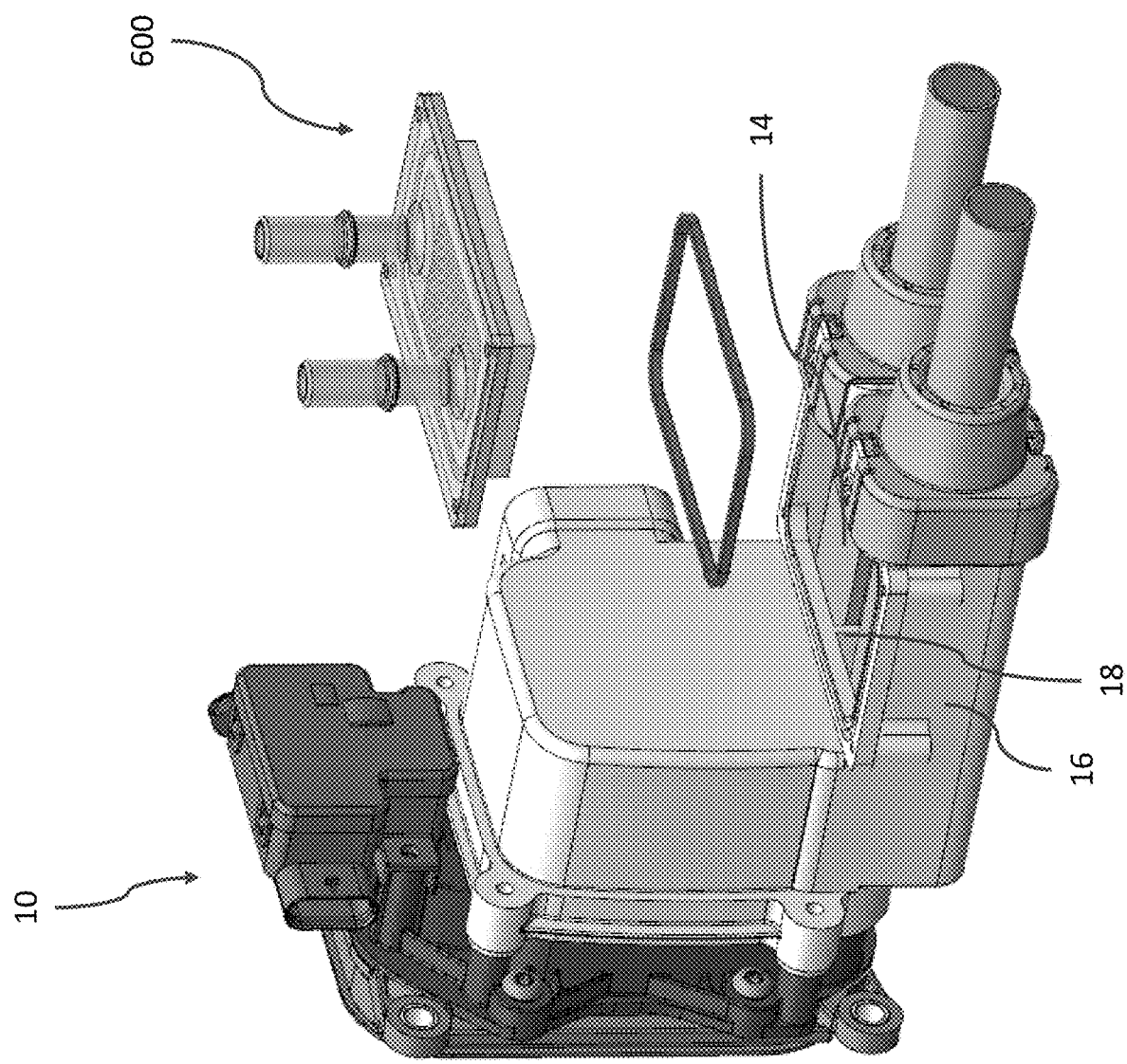
FIG. 16 is an exploded perspective view of an electrical connector assembly according to one embodiment of the invention.

A fifth cover configuration 500 having passive thermal management mechanism is illustrated in FIGS. 14 and 15. The cover 500 is formed of a thermally conductive material such an aluminum or copper-based material and has a number of parallel cooling fins 502 protruding from the cover 500. Alternatively, the cover 500 may be formed of a thermally conductive polymer. In this configuration the cavity 18 is filled with a dielectric thermally conductive potting material 504, such as an epoxy or silicone-based material that is in thermal communication with the cover 500. A silicone thermal grease may be applied intermediate the potting material 504 and the interior surface 506 of the cover 500.

In an alternative embodiment, the cavity 18 may be filled with a dielectric phase changing material (PCM). A PCM is a substance with a high heat of fusion, e.g., paraffins or lipids. The PCM melts and solidifies at a near constant temperature and can store and releasing large amounts of thermal energy. Heat is absorbed within the cavity 18 as the PCM gradually changes from a solid state to a liquid state when power is flowing through the terminals 14, 20 and then heat is gradually released through the cover 500 as the PCM changes from the liquid state back to the solid state when power is no longer flowing through the terminals 14, 20.

The potting material 504 and the phase change material used must have a breakdown voltage that is higher than the charging voltage of the vehicle charging system to which the assembly 10 is connected.

Alternative embodiments of the assembly 10 may be envisioned combining various elements described above. For example, the thermal potting material 504 or PCM of the fifth cover configuration 500 may be incorporated into the first, second or third cover configurations 100, 200, 300. In alternative embodiments, the cooling fins 502 of the fifth cover configuration 500 could be integrated into the first, second, third, or fourth cover configuration 100, 200, 300, 400.

Figure 17:
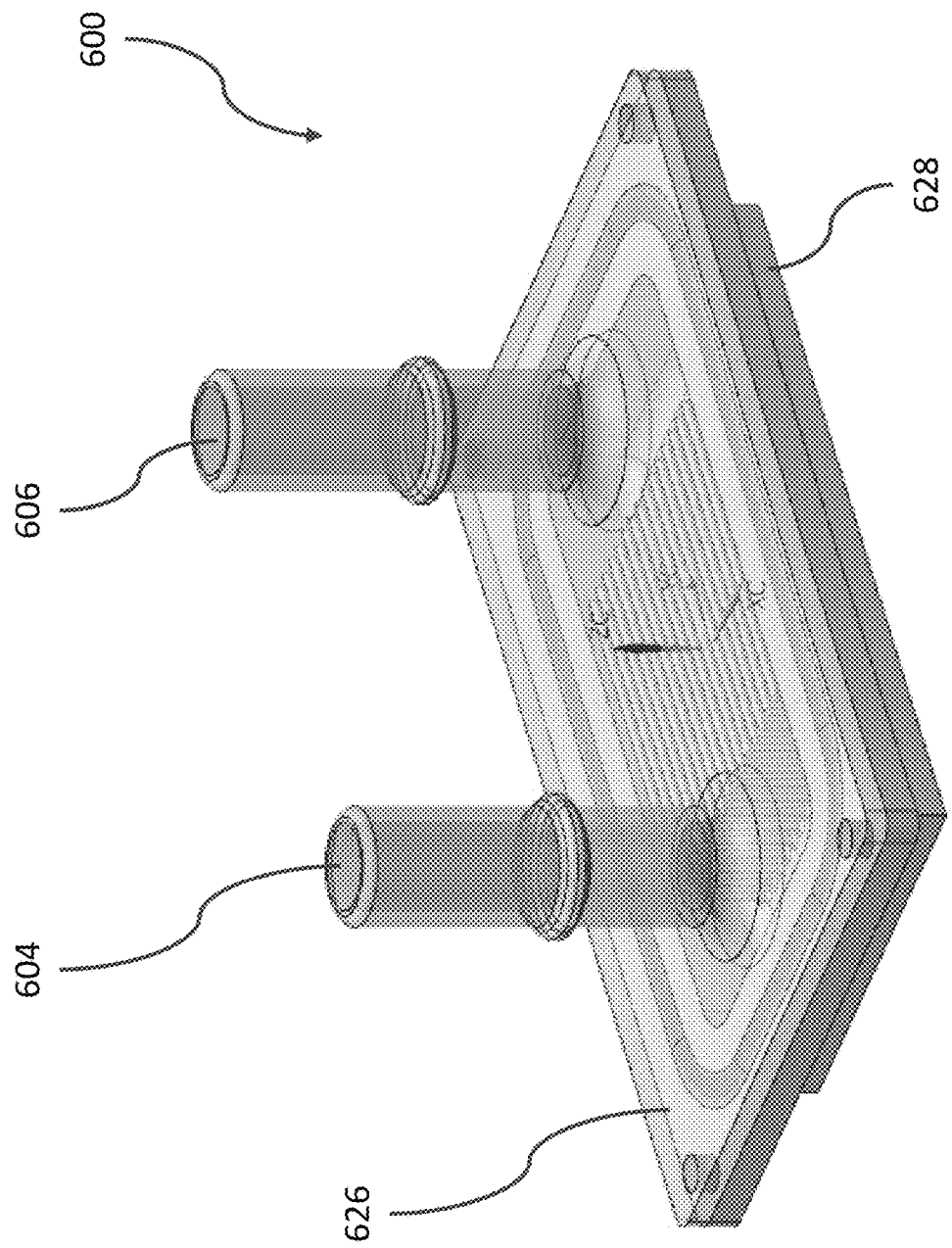
FIG. 17 is an isolated view of a liquid cooling plate of the electrical connector assembly of FIG. 16 according to one embodiment of the invention.

In a sixth cover configuration 600, an active thermal management mechanism illustrated in FIGS. 16 through 23B, the cover 600 is in intimate contact with the DC terminals 14 and is in thermal communication with the DC terminals 14 within the cavity 18. As shown in FIG. 17, the cover 600 includes a top cover 626 having a liquid inlet port 604 and a liquid outlet port 606 that is interconnected with the vehicle's cooling system 24, e.g., a liquid cooling system that cools the vehicle battery pack 22 and/or the vehicle power electronics similar to the illustration of FIG. 7. The vehicle's cooling system 24 includes a pump that causes the liquid coolant to flow through the cooling duct. In an alternative embodiment, the liquid inlet port 604 and the liquid outlet port 606 may be interconnected with a cooling system dedicated to cooling the assembly 10. The top cover 626 may be advantageously formed of a polymeric material to reduce weight of the top cover 626 and provide better electrical isolation compared to a metal top cover 626.

Figure 18:
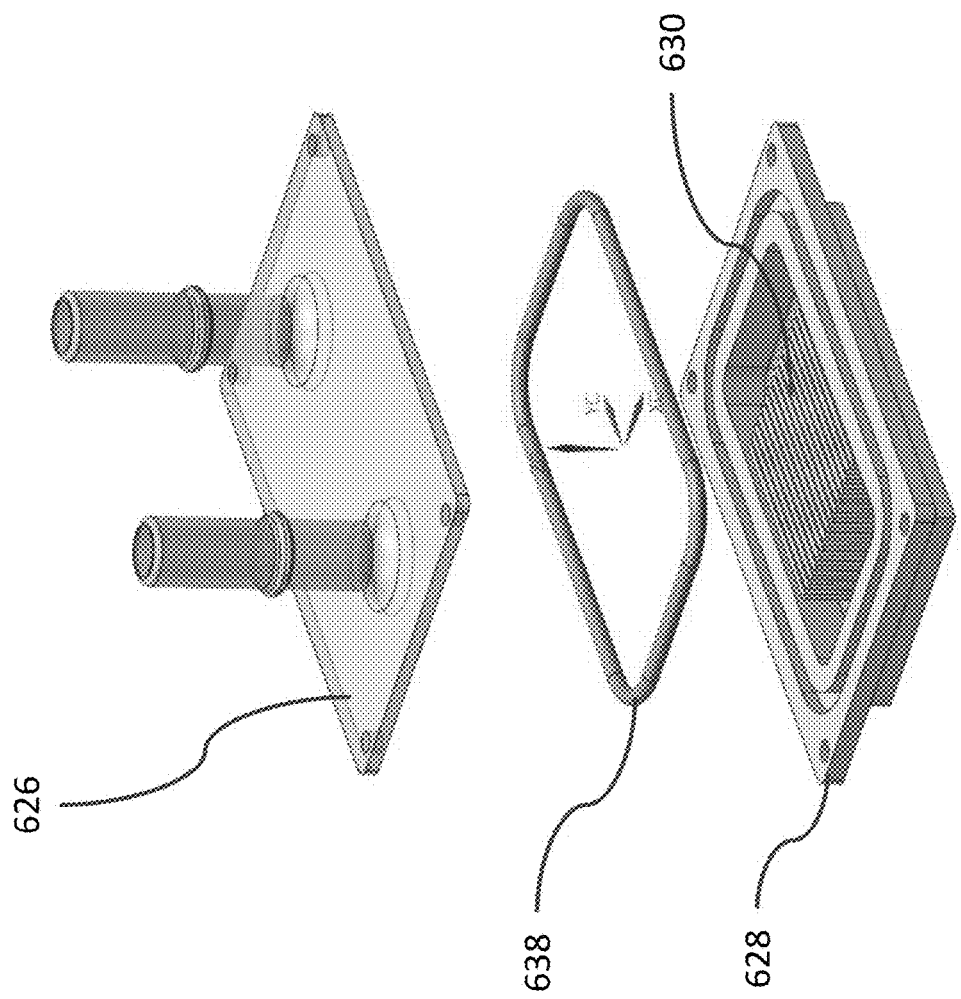
FIG. 18 is an exploded view of the liquid cooling plate of FIG. 17 while conducting 500 amperes according to one embodiment of the invention.
Figure 19:
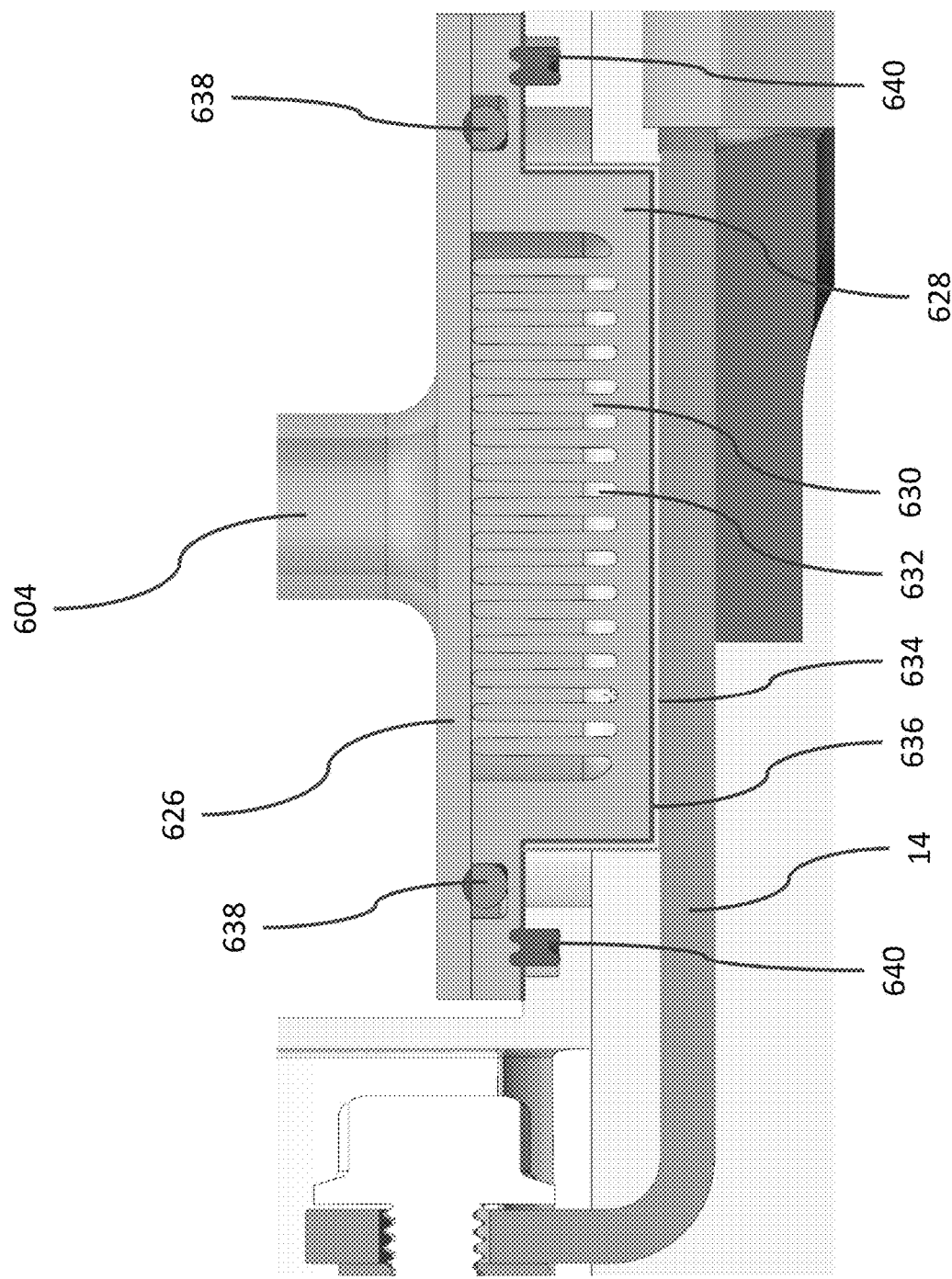
FIG. 19 is a cross section view of the electrical connector assembly of FIG. 16 according to one embodiment of the invention.

As shown in FIG. 18, the cover 600 also includes a bottom cover 628 that defines a coolant duct having a plurality of cooling fins 630 that define a plurality of coolant channels 632, best illustrated in FIG. 19, through which a liquid coolant flows from the liquid inlet port 604 to the liquid outlet port 606. The bottom cover 628 may be advantageously formed of a metallic material to optimize heat transfer between the cooling fins 630 and the liquid coolant. As illustrated in FIG. 19, it is the bottom cover 628 that is in intimate contact with the DC terminals 14. The bottom cover 628 further includes a dielectric thermal interface material layer 634 in direct contact with the DC terminals 14 and an additional dielectric material layer 636 intermediate the dielectric thermal interface material layer 634 and the coolant channels 632. The dielectric thermal interface material layer 634 and the additional dielectric material layer 636 provide robust electrical isolation between the DC terminals 14 and the metallic bottom cover 628.

The cover 600 also includes a primary coolant seal 638 between the top cover 626 and the bottom cover 628 and a secondary seal 640 between the cover 600 and the cavity 18 to ensure that the liquid coolant does not enter the cavity 18. Entry of the liquid coolant into the cavity 18 could cause a short circuit between the DC terminals 14.

Figure 20:
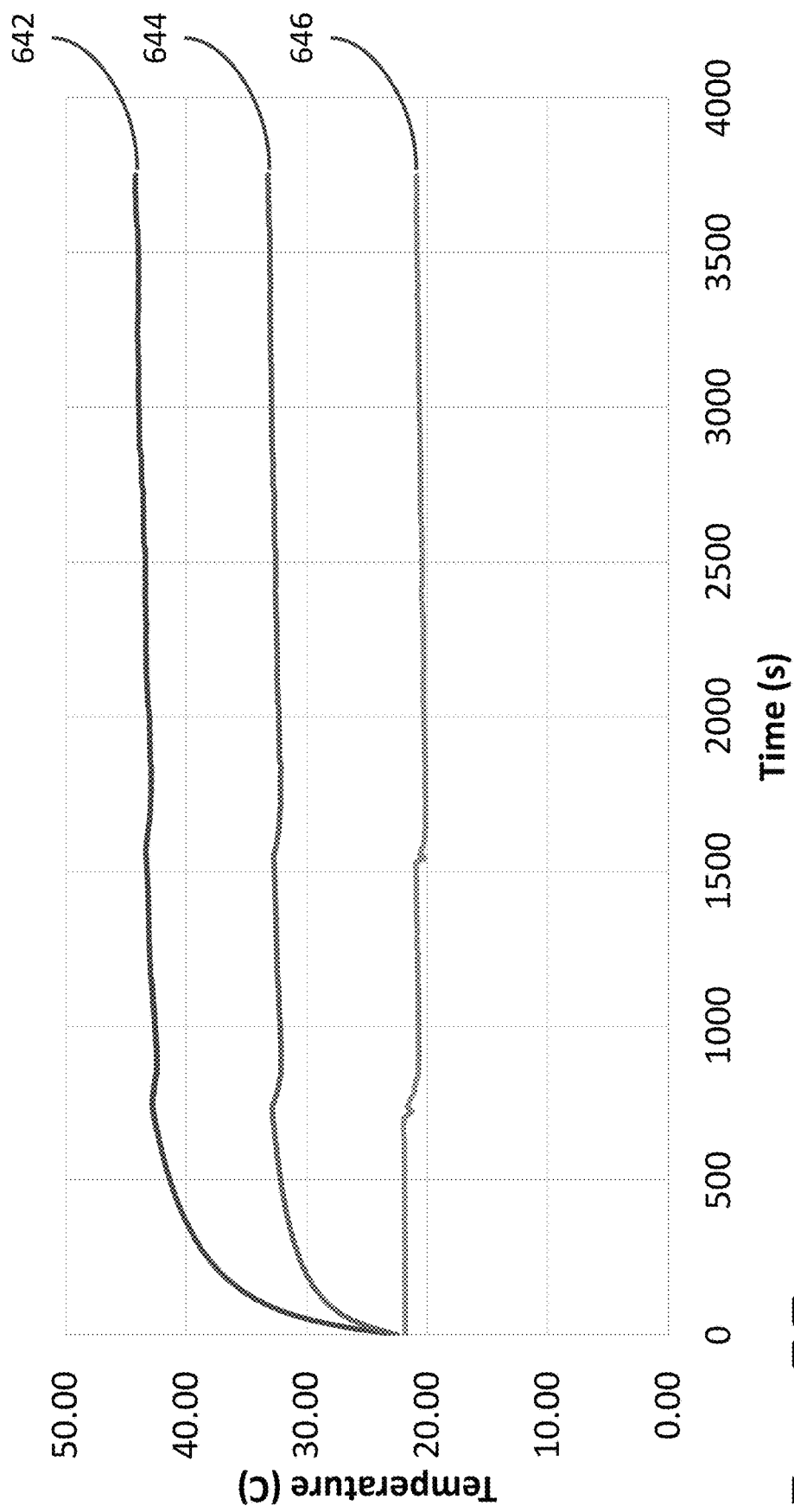
FIG. 20 is a graph of the temperature of various components electrical connector assembly of FIG. 16 while conducting 500 amperes according to one embodiment of the invention.
Figure 21:
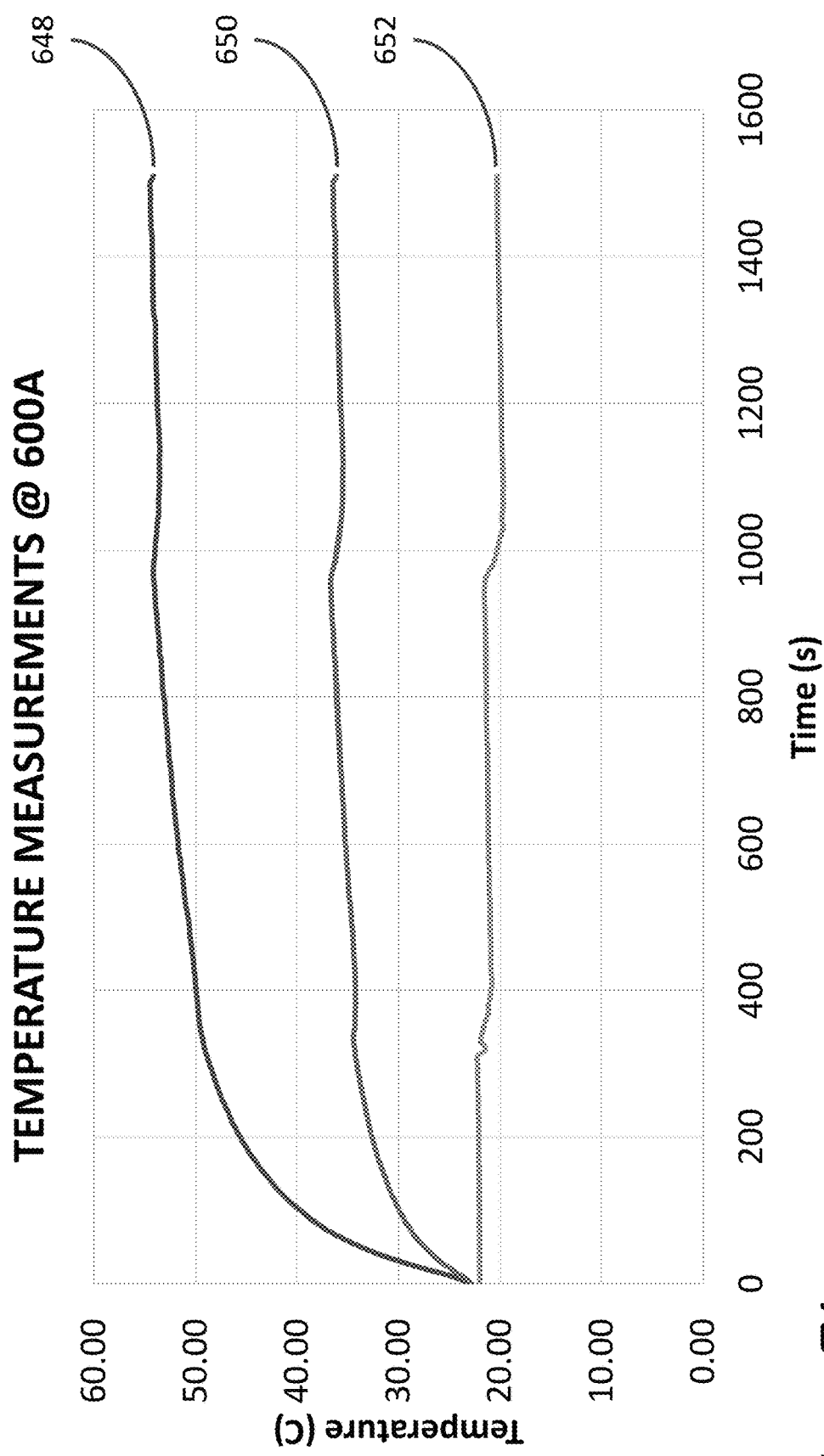
FIG. 21 is a graph of the temperature of various components electrical connector assembly of FIG. 16 while conducting 600 amperes according to one embodiment of the invention.
Figure 22:
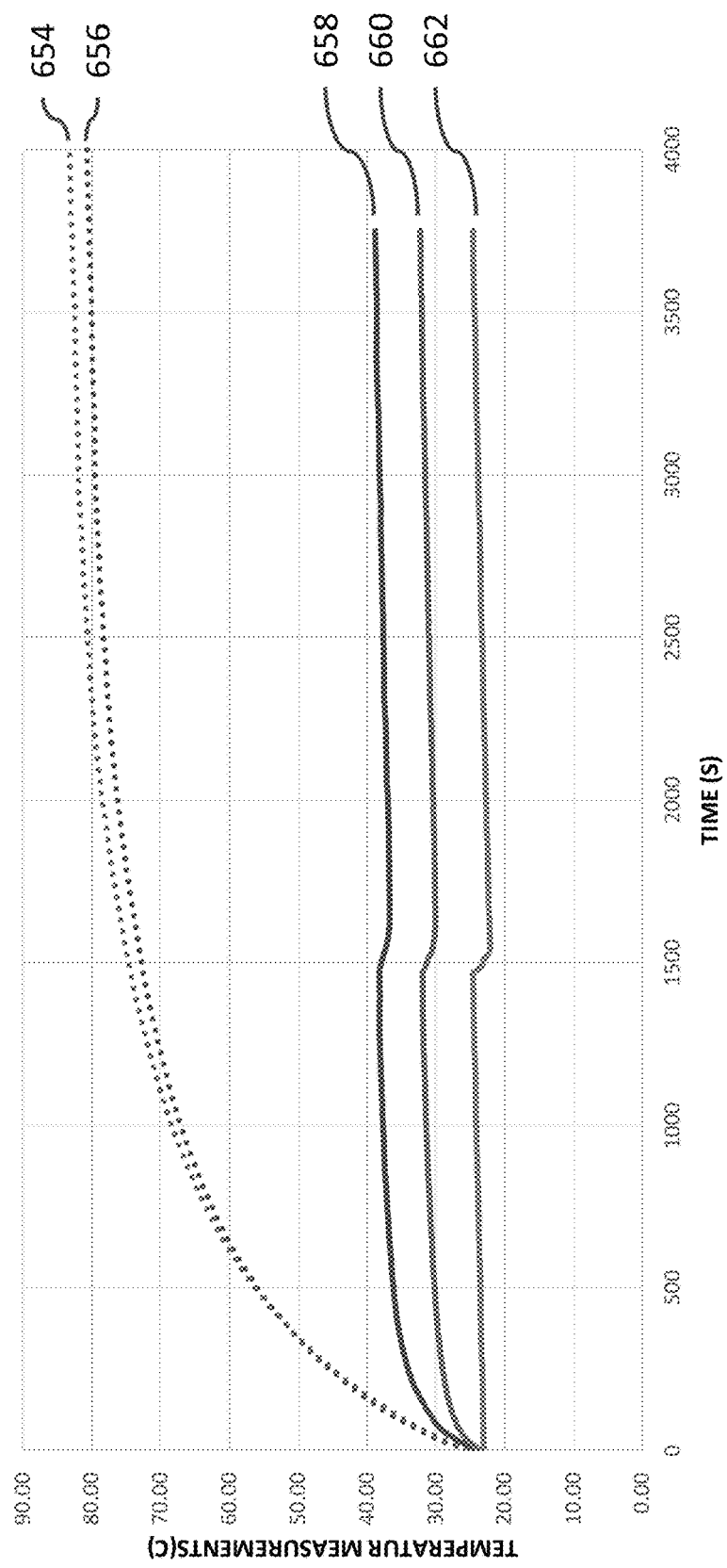
FIG. 22 is a graph of the temperature of various components electrical connector assembly of FIG. 16 compared to an alternative cooling system according to one embodiment of the invention.

Experimental results of the cooling performance of the cover 600 are shown in FIGS. 20-23B. FIG. 20 shows the temperature 642 of one of the electrical terminals 12, the temperature 644 of one of the terminals 14, and the inlet coolant temperature 646 as the assembly 10 is operated with a current of 500 amperes. FIG. 21 shows the temperature 648 of one of the electrical terminals 12, the temperature 650 of one of the terminals 14, and the inlet coolant temperature 652 as the assembly 10 is operated with a current of 500 amperes. FIG. 22 shows a comparison of the temperature 654 of one of the electrical terminals 12 and the temperature 656 of one of the terminals 14 with a cover having passive cooling, such as cover 100 with the temperature 658 of one of the electrical terminals 12, the temperature 660 of one of the terminals 14, and the inlet coolant temperature 662 as the assembly 10 under similar operating conditions. FIG. 23A shows the thermal gradient between the liquid inlet port 604 and the liquid outlet port 606 of the top cover 626 when the dissipated power is 100 watts. FIG. 23B shows the thermal gradient between the terminals 14 and the top cover 626 when the dissipated power is 100 watts.

Alternative embodiments may be envisioned which include features of several of the embodiments described above. Table 1 below describes at least some of the possible combinations.

TABLE 1

Cover Configurations

| Type | Cavity Contents | Cover Configuration | Additional Components |
|---|---|---|---|
| Passive 1 | Still Air | Polymer | None |
| Passive 2 | Thermal Potting Material | Thermally Conductive Polymer | None |
| Passive 3 | Thermal Potting Material | Externally Finned Metal | None |
| Passive 4 | Phase Change Material | Thermally Conductive Polymer | None |
| Passive 5 | Phase Change Material | Externally Finned Metal | None |
| Passive 6 | Still Air | Thermally Conductive Polymer | Thermal Interface Material |
| Passive 7 | Still Air | Externally Finned Metal | Thermal Interface Material |
| Active 1 | Moving Air | Polymer with Ports and Baffles | None |
| Active 2 | Thermal Potting Material | Cooling Plate | None |
| Active 3 | Thermal Potting Material | Cooling Plate | Thermoelectric Device |
| Active 4 | Still Air | Pass Trough | Cooled Polymer Terminal Position Assurance Device |
| Active 5 | Still Air | Pass Trough | Cooled Metallic Isolated Terminal Position Assurance Device |
| Active 6 | Still Air | Cooling Plate | Thermal Interface Material |
| Active 7 | Still Air | Cooling Plate with Internal Fins | Thermal Interface Material Layer, Insulation Layer, Primary and Secondary Seals |

While the illustrated example of the electrical connecter assembly 10 is a vehicle charging port, other embodiments of this invention may be envisioned for many other types of electrical connector assemblies.

Accordingly, an electrical connector assembly 10 is provided. The assembly 10 provides the benefits of thermally managing the temperature of the assembly 10. The assembly 10 also provides a common housing 16 that accepts number of cover configurations 100, 200, 300, 400, 500, 600 with different thermal management mechanisms, allowing the assembly 10 to be customized based on the thermal load and cooling infrastructure, e.g., liquid coolant availability, airflow availability, for the particular application of the assembly 10.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. An electrical connector assembly, comprising:
a connector housing defining a cavity from which a pair of electrical terminals extend and in which the pair of electrical terminals is partially disposed; and
a cover that is configured to enclose the cavity, thereby protecting the pair of electrical terminals and thermally manage heat within the cavity, wherein the cover has an integral thermal management mechanism including one or more liquid ports configured to receive a liquid coolant flow.

2. The electrical connector assembly according to claim 1, wherein the cover comprises a coolant duct having a liquid inlet port and a liquid outlet port configured to carry the liquid coolant flow therethrough.

3. The electrical connector assembly according to claim 1, wherein the cover is formed of an electrically nonconductive material.

4. The electrical connector assembly according to claim 1, wherein the cover is formed of a thermally conductive polymer.

5. The electrical connector assembly according to claim 1, wherein the cover is formed of a thermally conductive material.

6. The electrical connector assembly according to claim 1, wherein the cavity is filled with a thermally conductive potting material in thermal communication with the cover.

7. The electrical connector assembly according to claim 1, wherein the cavity is filled with a phase changing material in thermal communication with the cover.

8. An electrical connector assembly, comprising:
a connector housing defining a cavity in which a pair of electrical terminals is disposed; and
a cover that is configured to enclose the cavity, thereby protecting the pair of electrical terminals and thermally manage heat within the cavity, wherein the cover has a thermal management mechanism including one or more liquid ports configured to receive a liquid coolant flow, wherein the cover comprises a coolant duct having a liquid inlet port and a liquid outlet port configured to carry the liquid coolant flow therethrough, and wherein the coolant duct is characterized as following a serpentine path through the cover.

9. An electrical connector assembly, comprising:
a connector housing defining a cavity in which a pair of electrical terminals is disposed; and
a cover that is configured to enclose the cavity, thereby protecting the pair of electrical terminals and thermally manage heat within the cavity, wherein the cover has a thermal management mechanism including one or more liquid ports configured to receive a liquid coolant flow, wherein the cover includes a top cover having a liquid inlet port and a liquid outlet port and a bottom cover that defines a coolant duct.

10. The electrical connector assembly according to claim 9, wherein the top cover is formed of a polymeric material.

11. The electrical connector assembly according to claim 9, wherein the bottom cover is formed of a metallic material.

12. The electrical connector assembly according to claim 9, further comprising a primary coolant seal between the top cover and the bottom cover.

13. The electrical connector assembly according to claim 9, further comprising a secondary seal between the cover and the cavity.

14. The electrical connector assembly according to claim 9, wherein the liquid inlet port and the liquid outlet port are interconnected to a liquid cooling system of an electrically propelled vehicle.

15. The electrical connector assembly according to claim 9, wherein the bottom cover includes a plurality of cooling fins that define a plurality of coolant channels within the coolant duct.

16. The electrical connector assembly according to claim 15, further comprising a dielectric thermal interface material layer in direct contact with the pair of electrical terminals, wherein the dielectric thermal interface material layer is disposed between the bottom cover and the pair of electrical terminals.

17. The electrical connector assembly according to claim 16, wherein the dielectric thermal interface material layer is in direct contact with the bottom cover.

18. The electrical connector assembly according to claim 16, further comprising an additional dielectric material layer intermediate the dielectric thermal interface material layer and the plurality of coolant channels.

\* \* \* \* \*